(12) United States Patent
Reznicek et al.

(10) Patent No.: US 11,362,194 B2
(45) Date of Patent: Jun. 14, 2022

(54) TRANSISTOR HAVING CONFINED SOURCE/DRAIN REGIONS WITH WRAP-AROUND SOURCE/DRAIN CONTACTS

(71) Applicant: International Business Machines Corporation, Armonk, NY (US)

(72) Inventors: Alexander Reznicek, Troy, NY (US); Ruilong Xie, Niskayuna, NY (US); Kangguo Cheng, Schenectady, NY (US); Marc A. Bergendahl, Rensselaer, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/749,171

(22) Filed: Jan. 22, 2020

(65) Prior Publication Data
US 2021/0226032 A1 Jul. 22, 2021

(51) Int. Cl.
| | |
|---|---|
| *H01L 29/66* | (2006.01) |
| *H01L 29/78* | (2006.01) |
| *H01L 29/417* | (2006.01) |
| *H01L 29/08* | (2006.01) |
| *H01L 29/40* | (2006.01) |
| *H01L 21/20* | (2006.01) |
| *H01L 21/8234* | (2006.01) |
| *H01L 21/311* | (2006.01) |

(52) U.S. Cl.
CPC ...... *H01L 29/6653* (2013.01); *H01L 21/2018* (2013.01); *H01L 21/823431* (2013.01); *H01L 29/0847* (2013.01); *H01L 29/401* (2013.01); *H01L 29/41791* (2013.01); *H01L 29/66795* (2013.01); *H01L 29/785* (2013.01); *H01L 21/31122* (2013.01); *H01L 2029/7858* (2013.01)

(58) Field of Classification Search
CPC ............... H01L 29/0847; H01L 29/41791
See application file for complete search history.

(56) References Cited

U.S. PATENT DOCUMENTS

| | | |
|---|---|---|
| 7,241,700 B1 | 7/2007 | En et al. |
| 9,293,459 B1 | 3/2016 | Cheng et al. |
| 9,318,582 B2 | 4/2016 | Basker et al. |
| (Continued) | | |

*Primary Examiner* — Farun Lu
(74) *Attorney, Agent, or Firm* — Cantor Colburn LLP; Randall Bluestone

(57) ABSTRACT

Embodiments of the invention are directed to a method of forming a semiconductor device on an integrated circuit (IC). The method includes forming a containment structure having a non-sacrificial fin-containment region and a sacrificial fin-containment region, wherein the containment structure is configured to define a source or drain (S/D) cavity. A S/D region is formed in the S/D cavity. The S/D region includes a contained S/D region defined by the containment structure. The S/D region further includes a non-contained S/D region positioned above the containment structure. The IC is exposed to an etchant that is selective to the sacrificial fin-containment region, non-selective to the non-sacrificial fin-containment region, and non-selective to a plurality of spacers on the IC. Exposing the IC to the etchant selectively removes the sacrificial fin-containment region and exposes sidewalls of the contained S/D region.

19 Claims, 19 Drawing Sheets

(56) References Cited

U.S. PATENT DOCUMENTS

| | | | |
|---|---|---|---|
| 9,397,003 | B1 | 7/2016 | Niimi et al. |
| 9,847,390 | B1 | 12/2017 | Xie et al. |
| 10,121,868 | B1 | 11/2018 | Qi et al. |
| 2014/0209855 | A1 | 7/2014 | Cea et al. |
| 2016/0005868 | A1 | 1/2016 | Wei et al. |
| 2016/0190262 | A1 | 6/2016 | Xie et al. |
| 2017/0110578 | A1* | 4/2017 | Okuno ................. H01L 29/165 |
| 2017/0110580 | A1* | 4/2017 | Xiao ................... H01L 27/0922 |
| 2018/0090582 | A1 | 3/2018 | Adusumilli et al. |
| 2018/0269324 | A1* | 9/2018 | Cheng ................ H01L 23/5283 |
| 2021/0134980 | A1* | 5/2021 | Lee ................... H01L 29/42376 |

* cited by examiner

TRANSISTOR HAVING CONFINED SOURCE/DRAIN REGIONS WITH WRAP-AROUND SOURCE/DRAIN CONTACTS

BACKGROUND

The present invention relates in general to fabrication methods and resulting structures for semiconductor devices. More specifically, the present invention relates to fabrication methods and resulting structures for transistors having confined source/drain (S/D) regions with wrap-around S/D contacts.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. FinFETs are non-planar, three-dimensional (3D) devices that include a fin-shaped element that defines the source, drain, and channel regions of the FinFET. A gate stack is formed over and around a central region of the fin-shaped element, and the portion of the fin that is under the gate stack functions as the FinFET channel. The portions of the fin-shaped element that are not under the gate stack function as the source region and the drain region, respectively. Nanosheet transistors are similar to FinFETs except the channel portion of the fin is formed as multiple spaced-apart channel nanosheets, and the gate stack wraps around the full perimeter of each nanosheet channel region for improved control of channel current flow. Nanosheet transistors enable full depletion in the nanosheet channel regions and reduce short-channel effects.

The use of silicon germanium (SiGe) in semiconductor devices such as FinFETs and nanosheet transistors provides desirable device characteristics, including the introduction of strain at the interface between the SiGe of the active device and the underlying silicon substrate. The fin-shaped S/D regions of a FinFET (or nanosheet transistor) device can be formed as epitaxially grown and in-situ doped SiGe. Fin-sidewall-spacer (FSS) structures can be used to help confine the S/D regions during epitaxial growth thereof, thereby controlling the volume and lateral spread of the S/D region.

SUMMARY

Embodiments of the invention are directed to a method of forming a semiconductor device on an integrated circuit (IC). The method includes forming a containment structure having a non-sacrificial fin-containment region and a sacrificial fin-containment region, wherein the containment structure is configured to define a source or drain (S/D) cavity. An S/D region is formed in the S/D cavity. The S/D region includes a contained S/D region defined by the containment structure. The S/D region further includes a non-contained S/D region positioned above the containment structure. The IC is exposed to an etchant that is selective to the sacrificial fin-containment region, non-selective to the non-sacrificial fin-containment region, and non-selective to a plurality of spacers on the IC. Exposing the IC to the etchant selectively removes the sacrificial fin-containment region and exposes sidewalls of the contained S/D region.

Embodiments of the invention are directed to a method of forming a semiconductor device on an IC. The method includes forming a containment structure from a first channel fin structure, a second channel fin structure, and a sacrificial fin-containment region, wherein the containment structure is configured to define a S/D cavity. A S/D region is formed in the S/D cavity. The S/D region includes a contained S/D region defined by the containment structure. The S/D region further includes a non-contained S/D region positioned above the containment structure. The IC is exposed to an etchant that is selective to the sacrificial fin-containment region, non-selective to the non-sacrificial fin-containment region, and non-selective to a plurality of spacers on the IC. Exposing the IC to the etchant selectively removes the sacrificial fin-containment region and exposes sidewalls of the contained S/D region.

Embodiments of the invention are directed to a semiconductor device configured to include a containment structure and a S/D cavity at least partially defined by the containment structure. A S/D region is formed in the S/D cavity. The S/D region includes a contained S/D region, along with a non-contained S/D region positioned above the containment structure. A wrap-around S/D contact is positioned on exposed sidewalls of the contained S/D region and the non-contained S/D region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-6 depicts cross-sectional views of a portion of an integrated circuit (IC) wafer after fabrication operations for forming confined/embedded S/D regions according to aspects of the invention, in which:

FIG. 2 depicts cross-sectional views of the portion of the IC wafer after a fabrication operation according to embodiments of the invention;

FIG. 3 depicts cross-sectional views of the portion of the IC wafer after a fabrication operation according to embodiments of the invention;

FIG. 4 depicts cross-sectional views of the portion of the IC wafer after a fabrication operation according to embodiments of the invention;

FIG. 5 depicts cross-sectional views of the portion of the IC wafer after a fabrication operation according to embodiments of the invention; and FIG. 6 depicts cross-sectional views of the portion of the IC wafer after a fabrication operation according to embodiments of the invention;

FIGS. 7-12 depicts cross-sectional views of the portion of the IC wafer after fabrication operations for forming confined S/D regions with wrap-around contacts according to aspects of the invention, in which:

FIG. 7 depicts cross-sectional views of the portion of the IC wafer after a fabrication operation according to embodiments of the invention;

FIG. 8 depicts cross-sectional views of the portion of the IC wafer after a fabrication operation according to embodiments of the invention;

FIG. 9 depicts cross-sectional views of the portion of the IC wafer after a fabrication operation according to embodiments of the invention;

FIG. 10 depicts cross-sectional views of the portion of the IC wafer after a fabrication operation according to embodiments of the invention;

FIG. 11 depicts cross-sectional views of the portion of the IC wafer after a fabrication operation according to embodiments of the invention; and FIG. 12 depicts cross-sectional views of the portion of the IC wafer after a fabrication operation according to embodiments of the invention;

FIGS. 13-19 depicts cross-sectional views of the portion of the IC wafer after fabrication operations for forming confined S/D regions with wrap-around contacts according to aspects of the invention, in which:

FIG. 13 depicts cross-sectional views of the portion of the IC wafer after a fabrication operation according to embodiments of the invention;

FIG. 14 depicts cross-sectional views of the portion of the IC wafer after a fabrication operation according to embodiments of the invention;

FIG. 15 depicts cross-sectional views of the portion of the IC wafer after a fabrication operation according to embodiments of the invention;

FIG. 16 depicts cross-sectional views of the portion of the IC wafer after a fabrication operation according to embodiments of the invention;

FIG. 17 depicts cross-sectional views of the portion of the IC wafer after a fabrication operation according to embodiments of the invention;

FIG. 18 depicts cross-sectional views of the portion of the IC wafer after a fabrication operation according to embodiments of the invention; and FIG. 19 depicts cross-sectional views of the portion of the IC wafer after a fabrication operation according to embodiments of the invention.

DETAILED DESCRIPTION

Figure 1:
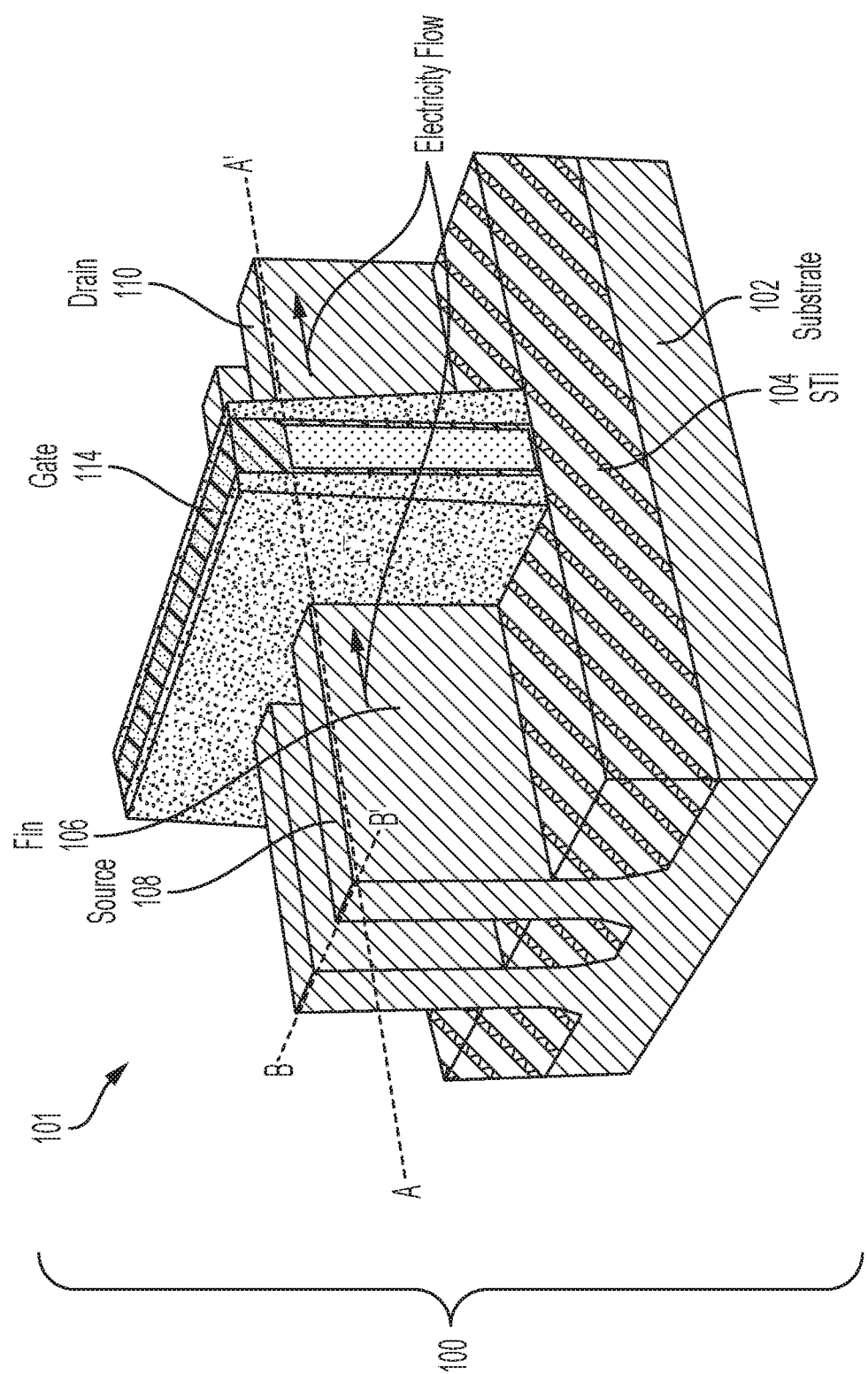
FIG. 1 depicts a three-dimensional view of a FinFET semiconductor device capable of incorporating aspects of the invention.

Although this detailed description includes examples of how aspects of the invention can be implemented to form confined S/D regions with wrap-around S/D contacts in an exemplary FinFET semiconductor device architecture having silicon (Si) channel fins and silicon germanium (SiGe) S/D regions, implementation of the teachings recited herein are not limited to a particular type of FET structure or combination of materials. Rather, embodiments of the present invention are capable of being implemented in conjunction with any other type of transistor device (e.g., planar FETs, vertical FETs, nanosheet transistors, and the like) or material, now known or later developed, wherein confined S/D regions are utilized, and wherein it is desirable to reduce resistance at the interface between the S/D contact and the S/D region through the use of a wrap-around S/D contact.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the FET as a non-planar FinFET architecture, wherein the channel of the FinFET is implemented as a fin-shaped structure, and wherein a gate stack is wrapped around sidewalls and a top surface of a central region of the fin-shaped structure. The portion of the fin-shaped structure that is under the gate stack functions as the channel, and the portions of the fin-shaped structure that are not under the gate stack are doped to function as the source region and the drain region, respectively. In some implementations, the fin-shaped structure is Si, and the S/D regions of the fin are formed as doped SiGe. The use of doped SiGe to form the S/D regions provides desirable device characteristics, including the introduction of strain at the various interfaces between SiGe and Si in the transistor.

Another known method of increasing channel conductivity and decreasing FET size is to form the channel as a nanosheet structure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial layers. The sacrificial layers are released from the channel nanosheets before the FET device is finalized. For n-type FETs, the channel nanosheets are typically Si and the sacrificial layers are typically SiGe. For p-type FETs, the channel nanosheets can be SiGe and the sacrificial layers can be Si. In some implementations, the channel nanosheet of a p-type FET can be SiGe or Si, and the sacrificial layers can be Si or SiGe. Similar to FinFET architectures, the S/D regions of a GAA nanosheet architecture can be formed from doped SiGe. Forming the S/D regions from SiGe, and the use of multiple layered SiGe/Si sacrificial/channel nanosheets (or Si/SiGe sacrificial/channel nanosheets) provide desirable device characteristics, including the introduction of strain at the interface between SiGe and Si.

In a variety of different transistor architectures, the S/D regions can be formed using so-called "embedded" fabrication techniques in which the S/D regions are formed within a confined area that prevents (or controls) undesired lateral spread of the S/D regions during S/D formation. For non-embedded S/D regions, sidewall surfaces of the non-embedded S/D regions are accessible after the S/D regions are formed, which enables the use of wrap-around S/D contacts that contact the S/D region on top and sidewall surfaces, thereby increasing the area of the interface between the S/D regions and the wrap-around S/D contacts. However, known methods of confining a S/D region rely on confinement structures (e.g., STI, fin sidewall spacers (FSS), and the like) that are impractical to remove after the confined/embedded S/D region is formed. Accordingly, the confinement structures used in known confined/embedded S/D fabrication techniques remain in place after the confined/embedded S/D region is formed, which results in a limited S/D surface area for interfacing the S/D region with S/D contacts. Hence, known confined S/D regions do not provide enough available surface area to use wrap-around S/D contacts. As a result, resistance at the interface between confined/embedded S/D regions and S/D contacts can be a major contributor to the total external parasitic resistance.

Turning now to an overview of aspects of the invention, embodiments of the invention provide fabrication methods and resulting structures for forming on an IC a transistor having confined/embedded S/D regions with wrap-around S/D contacts. In embodiments of the invention, the confined/embedded S/D region is formed in a confinement structure configured to include a non-sacrificial fin-confinement region (e.g., the channel fin of a FinFET/nanosheet device) and a sacrificial fin-confinement region. The sacrificial fin-confinement region is formed from a sacrificial fin-confinement material configured and arranged to have predetermined characteristics that enable the sacrificial fin-confinement region to confine the S/D region during S/D formation, and that further enable the sacrificial fin-confinement region to be selectively removed using conventional wet or dry etch operations that are non-selective to other spacer materials in the various device structures on the IC.

In accordance with aspects of the invention, a predetermined characteristic of the sacrificial fin-confinement material that enables the sacrificial fin-confinement region to confine the S/D region during S/D formation is high thermal stability. In other words, the sacrificial fin-confinement material is not substantially degraded when exposed to high temperatures (e.g., above about 600 degrees Celsius). High thermal stability makes the sacrificial fin-confinement material particularly suitable for withstanding exposure to high temperature processes such as the epitaxial growth operations that can be used to form embedded S/D regions adjacent the sacrificial fin-confinement material. In accordance with aspects of the invention, a temperature used in epitaxial growth operations can be within a range from about 400 degrees Celsius to about 700 degrees Celsius.

In accordance with aspects of the invention, the selective removal of the sacrificial fin-confinement material is facilitated by selecting a sacrificial fin-confinement material that it is selective to etchants that are not selective to other spacer materials in the various device structures on the IC. Spacers perform a variety of functions throughout an IC, and are conventionally formed from a dielectric material such as a silicon nitride or a silicon oxide. Accordingly, the sacrificial fin-confinement material is selective to etchants that are non-selective to spacer dielectric materials such as a silicon nitride dielectric materials and/or silicon oxide dielectric materials.

In accordance with aspects of the invention, removal of the sacrificial fin-confinement material is further facilitated by depositing the sacrificial fin-confinement material as a non-high-aspect-ratio layer that is more wide than narrow. Depositing the sacrificial fin-confinement material as a non-high-aspect-ratio layer provides a relatively larger top exposed surface area where a wet/dry etchant can easily interact with and remove the sacrificial fin-confinement material.

In accordance with aspects of the invention, a suitable sacrificial fin-confinement material is spin-on carbon (SOC) or amorphous carbon material that can be applied and formed according to any prior art processes, including, for example, spin-coating. A suitable spin-on carbon (or amorphous carbon) material can include at least about 80% carbon atoms, based upon the total number of atoms in all the solids in the composition taken as 100%. One having ordinary skill in the art can readily calculate this percentage based upon the chemical structure of the solids included in the composition. A suitable spin-on carbon (or amorphous carbon) material can include from about 80% to about 98% carbon atoms. Spin-on carbon (or amorphous carbon) exhibits high thermal stability and can be selectively removed using conventional wet or dry etch operations that are selective to spin-on carbon (or amorphous carbon) and non-selective to other portions of the transistor (e.g., STI, the S/D regions, spacers, etc.). In embodiments of the invention, the selective etch operations can include the application of oxygen or $N_2/H_2$ ashing. In embodiments of the invention, in addition to spin-on-carbon (or amorphous carbon), any other material having etch selectivity to both oxide and nitride, and that is configured to tolerate high temperature (e.g., above about 400 degrees Celsius) processes, can be used as a sacrificial fin-confinement material. Examples of such sacrificial fin-confinement material include but are not limited to SiC, $TiO_X$, and the like.

In accordance with aspects of the invention, subsequent to removal of the sacrificial fin-confinement region, previously-confined sidewalls and upper surfaces of the S/D region are exposed, and a wrap-around S/D contact is formed on the exposed sidewalls and upper surfaces of the S/D region. In accordance with some aspects of the invention, the wrap-around S/D contact can be formed by depositing a sacrificial liner on the exposed sidewalls and upper surfaces of the S/D region. In accordance with aspects of the invention, the sacrificial liner functions as a placeholder that defines (and reserves) a space that will be occupied by portions of the to-be-formed wrap-around S/D contact. A layer of fill material (e.g., an interlayer dielectric (ILD) is deposited over the sacrificial liner. In embodiments of the invention, the fill material is deposited conformally such that the fill material does not completely pinch off, thereby forming an air gap in the fill material. In embodiments of the invention, the air gap is positioned between adjacent S/D regions. In embodiments of the invention, a portion of the fill material is removed to define a top region of the wrap-around S/D contact, and to expose portions of the sacrificial liner. An etch operations is applied to the exposed portions of the sacrificial liner to remove the sacrificial liner such that the removed portion of the fill material and the space that was occupied by the sacrificial liner define a wrap-around S/D contact cavity or trench. Known metal deposition techniques can be used to form the wrap-around S/D contact within the wrap-around S/D contact cavity, and to further form the wrap-around S/D contact on the sidewalls and upper surfaces of the S/D region.

In accordance with some aspects of the invention, the wrap-around S/D contact can be formed by depositing a sacrificial layer over the exposed sidewalls and upper surfaces of the S/D region. In accordance with aspects of the invention, the sacrificial layer is a non-high-aspect-ratio layer that is more wide than narrow. Selected regions of the sacrificial layer are removed (e.g., through cutting) such that the remaining portion of the sacrificial layer defines the area of a to-be-formed wrap-around S/D contact trench that will be occupied by the to-be-formed wrap-around S/D contact. The area that was occupied by the removed portions of the sacrificial layer are filled with a fill material (e.g., a dielectric), and the remaining portion of the sacrificial layer is removed to expose sidewalls and upper surfaces of the S/D region, thereby forming a wrap-around S/D contact trench. Known metal deposition techniques can be used to form the wrap-around S/D contact within the wrap-around S/D contact trench, and on the sidewalls and upper surfaces of the S/D region.

Turning now to a more detailed description of aspects of the invention, FIG. 1 depicts a three-dimensional view of a portion of an IC wafer 100 having formed thereon a pair of FinFET semiconductor devices 101 capable of incorporating aspects of the invention. The basic electrical layout and mode of operation of the FinFETs 101 do not differ significantly from a traditional field effect transistor. The FinFETs 101 are formed on a semiconductor substrate 102, and STI regions 104 electrically isolate the FinFETs from one another. Each FinFET 101 includes a fin 106 and a shared gate stack 114, configured and arranged as shown. Each fin 106 includes a source region 108, a drain region 110, and a channel region (not shown), wherein the portion of the fin 106 that is under the gate stack 114 functions as the channel region. In contrast to planar MOSFETs, the source 108, the drain 110, and the channel are built as a three-dimensional bar on top of the STI layer 104 and the semiconductor substrate 102. The fin 106 serves as the main body of the FinFET device 101, and the gate stack 114 is wrapped over the top and sides of the fins 106. The gate stack 114 controls the source to drain current flow (labeled ELECTRICITY FLOW in FIG. 1). The dimensions of the fins 106 establish the effective channel length for the FinFET 101. For ease of illustration, two fins 106 and one gate stack 114 are shown in FIG. 1. In practice, FinFET devices can be fabricated having any number of fins 106 and gate stacks 114 formed on the substrate 102. The substrate 102 can be silicon, the STI regions 104 can be an oxide (e.g., silicon oxide), and the fins 106 can be silicon that has been etched to form the desired fin shape.

FIGS. 2-6 depict cross-sectional views of a portion of an IC wafer 100A after fabrication operations for forming S/D regions 502 (shown in FIG. 5) having confined S/D regions 504 (shown in FIG. 5) and non-confined S/D regions 506 (shown in FIG. 5) according to aspects of the invention.

FIGS. 2-6, 7-12, and 13-19 each depict two cross-sectional views of the IC wafer 100A. In addition to illustrating exemplary FinFETs 101 capable of integrating aspects of the invention, the IC wafer 100 also provides reference lines (A-A' and B-B') for the cross-sectional views shown in FIGS. 2-6, 7-12, and 13-19. In FIGS. 2-6, 7-12, and 13-19, the leftmost cross-sectional view is a view taken along line A-A' of the IC wafer 100, and the rightmost cross-sectional view is the view taken along line B-B' of the IC wafer 100. Where appropriate, structures in FIGS. 2-6, 7-12, and 13-19 that correspond to structures shown in FIG. 1 are provided with the same or similar reference numbers.

Figure 2:
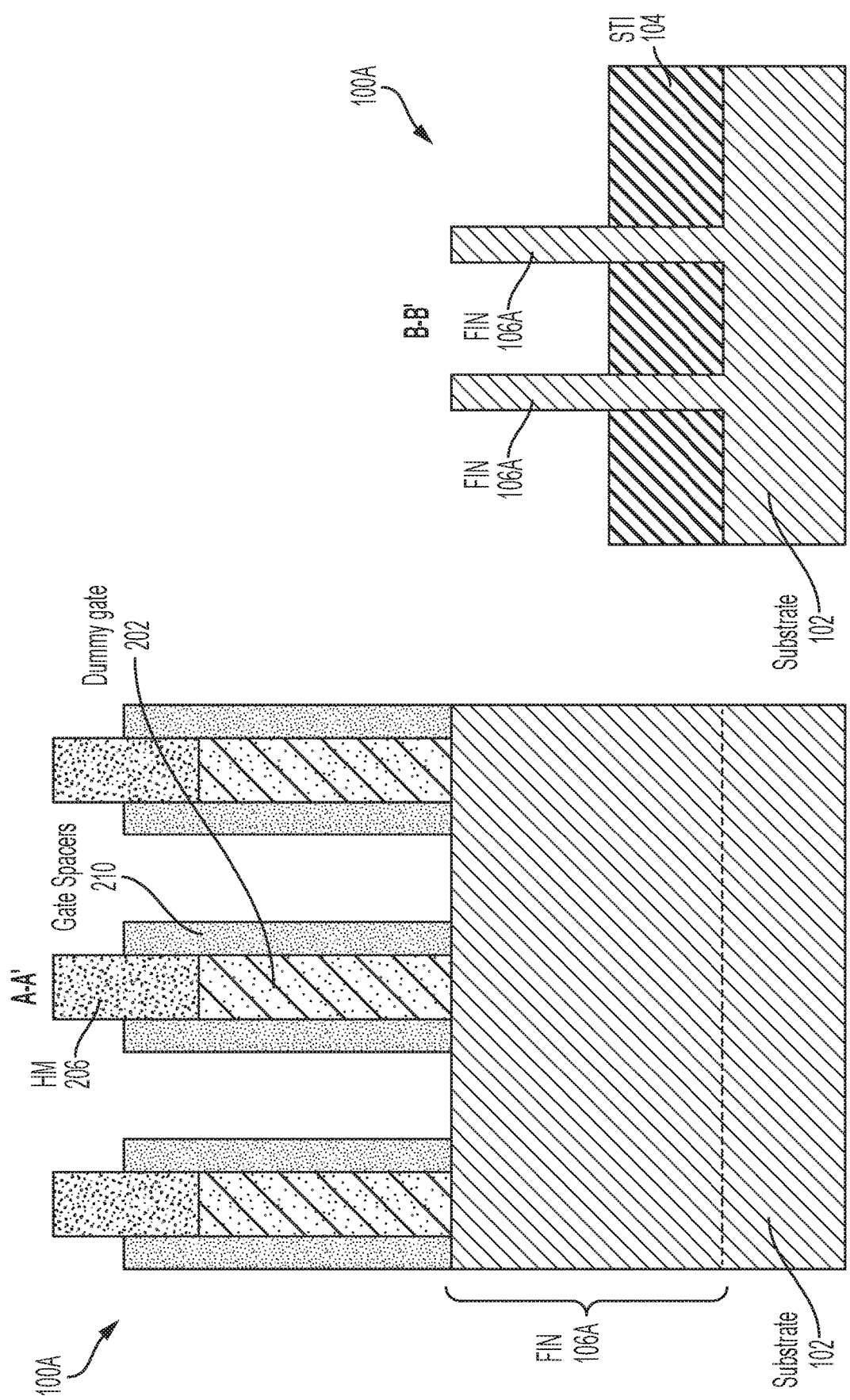

Referring now to FIG. 2, known fabrication techniques have been used to form an initial structure on the IC wafer 100A, which corresponds in general to the IC wafer 100 (shown in FIG. 1). In accordance with aspects of the invention, the substrate 102 of the IC wafer 100A includes a variety of structures having formed thereon a variety of IC devices that utilize a variety of spacer structures. A variety of fabrication operations are suitable for forming the initial structure of the IC wafer 100A. Because these fabrication operations are well-known, many of these details have been omitted in the interest of brevity. In embodiments of the invention, the initial structure of the IC wafer 100A includes a substrate 102, which can be made of any suitable substrate material, such as monocrystalline Si, SiGe, SiC, III-V compound semiconductor, II-VI compound semiconductor, or semiconductor-on-insulator (SOI). The fins 106A are formed over a major surface of the substrate 102. In some embodiments of the invention, the fins 106A are formed from Si. As best shown in the B-B' view of FIG. 2, shallow-trench isolation (STI) regions 104 can be formed by depositing a local oxide (e.g., $SiO_2$) between the fins 106A and over the substrate 102. The local oxide is polished and recessed back to form the STI regions 104, and to expose the upper portions of the fins 106A. As best shown in the A-A' view of FIG. 2, dummy gates 202 having hard masks (HM) 206 and gate spacers 210 are formed over and around the fins 106A in a similar manner to how the gate stack 114 (shown in FIG. 1) is formed over and around the fins 106 (shown in FIG. 1). The dummy gates 202 can be formed from any suitable poly-silicon material, including, for example, amorphous silicon (aSi).

Figure 3:
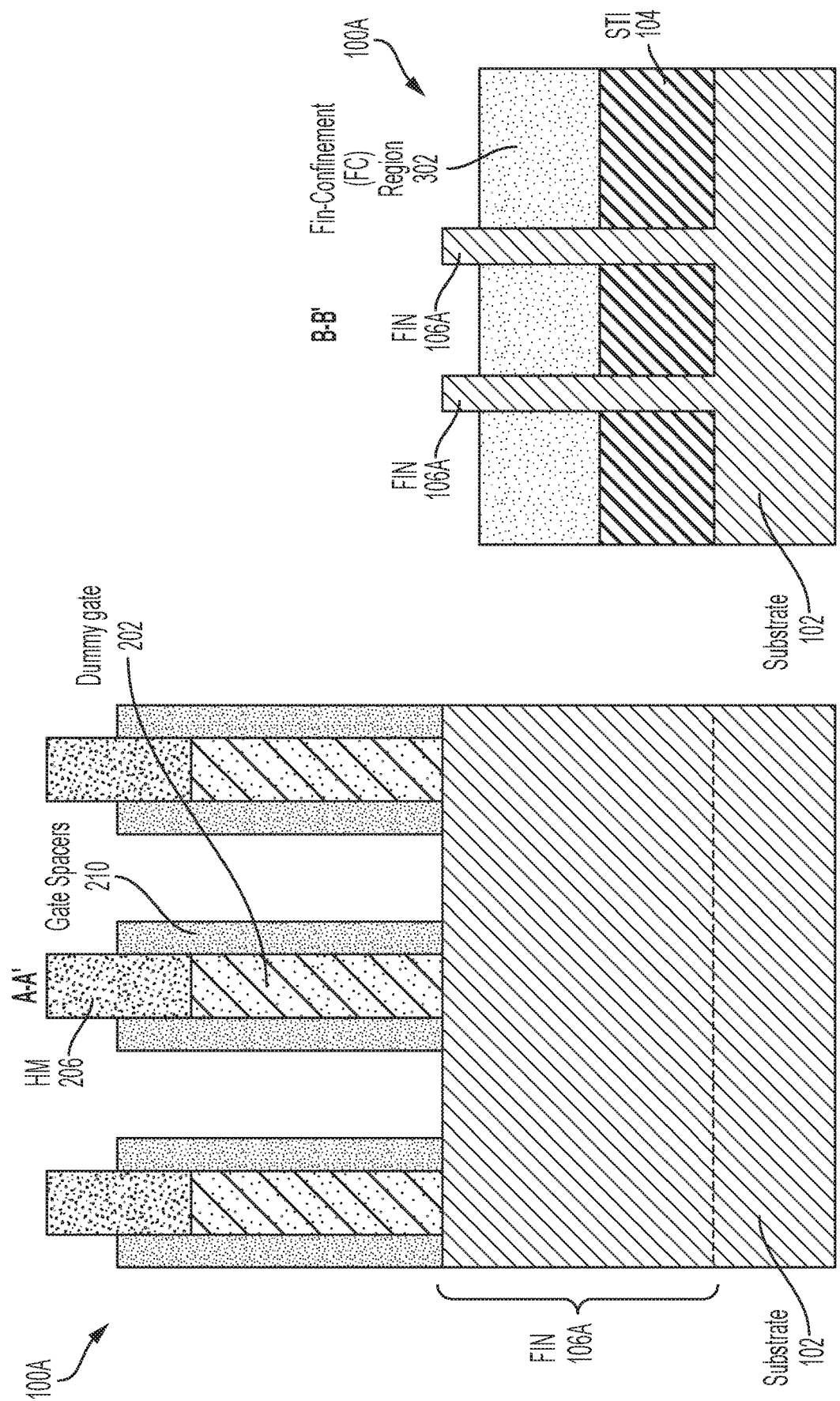

In FIG. 3, as best shown in the B-B' view, known fabrication operations have been used to deposit sacrificial fin-confinement regions 302 over the STI regions 104 and adjacent exposed upper sections of the fins 106A. In embodiments of the invention, depositing the sacrificial fin-confinement regions 302 completes the formation of a confinement structure that is configured to include the sacrificial fin-confinement regions 302 and non-sacrificial fin-confinement regions, which, in accordance with embodiments of the invention, can include the lower regions of the fins 106A and the channel regions 402, 402A, 402B (shown in FIG. 4) of the fins 106A. The sacrificial fin-confinement regions 302 are formed from a sacrificial fin-confinement material configured and arranged to have predetermined characteristics that enable the sacrificial fin-confinement regions 302 to confine the S/D confinement regions 504 (shown in FIG. 5) of the S/D regions 502 (shown in FIG. 5) during formation of the S/D regions 502, and that further enable the sacrificial fin-confinement region 302 to be selectively removed using conventional wet or dry etch operations. In accordance with aspects of the invention, high thermal stability is a predetermined characteristic of the sacrificial fin-confinement material that enables the sacrificial fin-confinement regions 302 to confine the confined S/D regions 504 of the S/D regions 502 during formation of the S/D regions 502. In other words, the sacrificial fin-confinement material is not substantially degraded when exposed to high temperatures (e.g., about 600 degrees Celsius), which makes the sacrificial fin-confinement material particularly suitable for withstanding exposure to high temperature processes such as the epitaxial growth operations that can be used to form the partially confined/embedded S/D regions 502 adjacent the sacrificial fin-confinement regions 302. In accordance with aspects of the invention, a temperature used in epitaxial growth operations can be within a range from about 400 degrees Celsius to about 700 degrees Celsius.

In accordance with aspects of the invention, the selective removal of the sacrificial fin-confinement material is facilitated by selecting a sacrificial fin-confinement material that it is selective to etchants that are not selective to other spacer materials and/or device structures in or on the IC 100A. Spacers, which are conventionally formed from a dielectric material such as a silicon nitride or a silicon oxide, perform a variety of functions throughout an IC. Accordingly, in accordance with aspects of the invention, the sacrificial fin-confinement material is selective to etchants that are non-selective to spacer dielectric materials such as a silicon nitride dielectric materials and/or silicon oxide dielectric materials.

In accordance with aspects of the invention, downstream removal (shown in FIG. 6) of the sacrificial fin-confinement regions 302 is further facilitated by forming the sacrificial fin-confinement regions 302 as non-high-aspect-ratio layers that are more wide than narrow. Forming the sacrificial fin-confinement regions 302 as non-high-aspect-ratio layers provides a relatively larger top exposed surface area where a wet/dry etchant can easily interact with and remove the sacrificial fin-confinement material.

In accordance with aspects of the invention, a suitable sacrificial fin-confinement material is spin-on carbon (SOC) or amorphous carbon material that can be applied and formed according to any prior art processes, including, for example, spin-coating. A suitable spin-on carbon (or amorphous carbon) material can include at least about 80% carbon atoms, based upon the total number of atoms in all the solids in the composition taken as 100%. One having ordinary skill in the art can readily calculate this percentage based upon the chemical structure of the solids included in the composition. A suitable spin-on carbon (or amorphous carbon) material can include from about 80% to about 98% carbon atoms. Spin-on carbon (or amorphous carbon) exhibits high thermal stability and can be selectively removed using conventional wet or dry etch operations that are selective to spin-on carbon (or amorphous carbon) and non-selective to other portions of the transistor (e.g., STI, the S/D regions, spacers, etc.). In embodiments of the invention, the selective etch operations can include the application of oxygen or $N_2/H_2$ ashing. In embodiments of the invention, in addition to spin-on-carbon (or amorphous carbon), any other material having etch selectivity to both oxide and nitride, and that is configured to tolerate high temperature (e.g., above about 400 degrees Celsius) processes, can be used as a sacrificial fin-confinement material. Examples of such sacrificial fin-confinement material include but are not limited to SiC, $TiO_x$, and the like.

Figure 4:
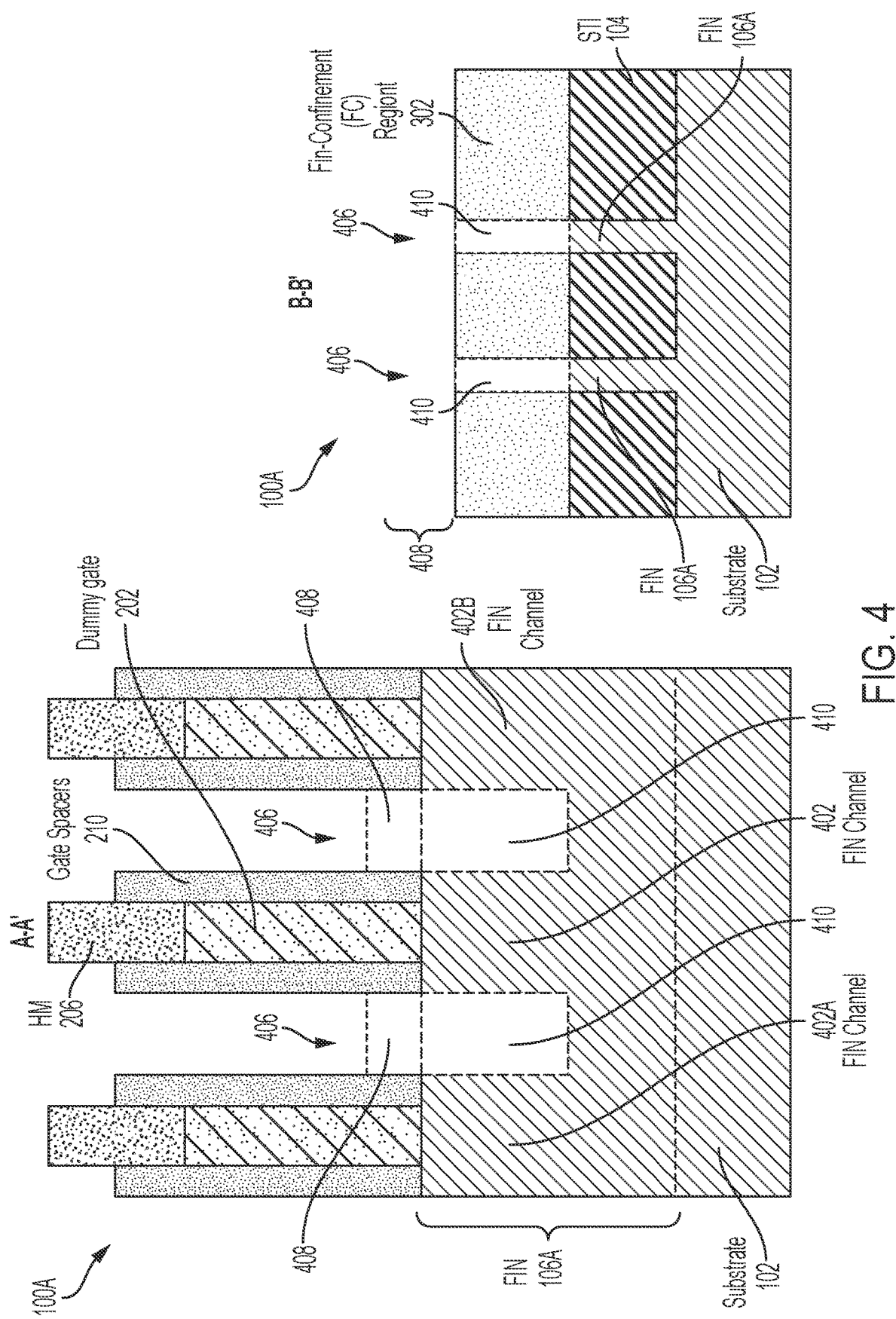

In FIG. 4, known fabrication operations (e.g., wet/dry etching) have been used to remove upper portions of the fins 106A, thereby forming S/D cavities 406 having S/D cavity confinement regions 410 and S/D cavity non-confinement regions 408. Forming the S/D cavities 406 also defines the fin channel regions 402, 402A, 402B of the fins 106A. In some aspects of the invention, all of the fin channel regions 402, 402A, 402B will be active channels in a final configuration of transistor devices on the IC wafer 100A. In some aspects of the invention, the fin channel region 402 will be an active channel in a final configuration of transistor devices on the IC wafer 100A, and one or both of the fin channel regions 402A, 402B will be inactive channels.

Figure 5:
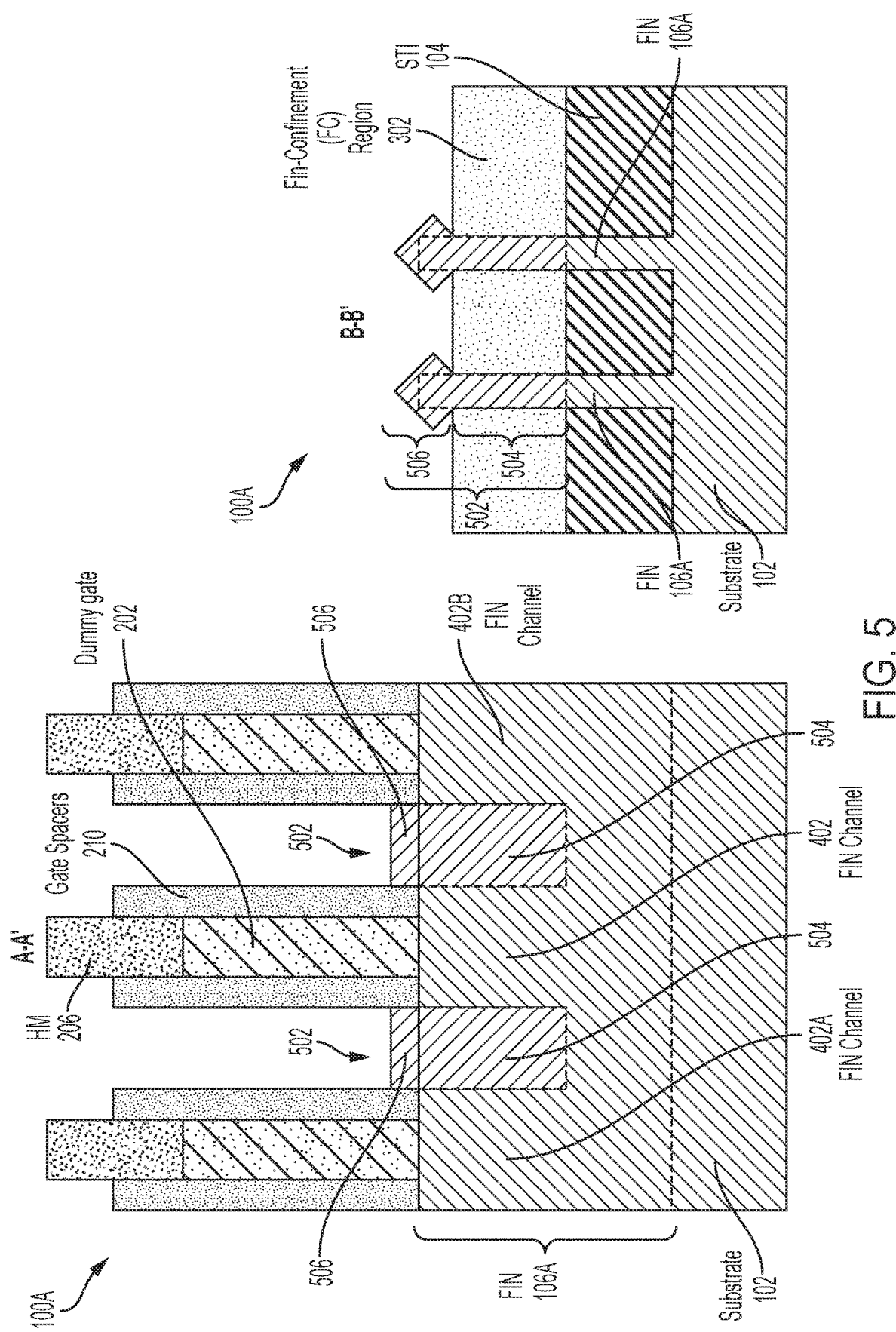

In FIG. 5, known fabrication operations have been used to form the S/D regions 502 in the S/D cavities 406 (shown in FIG. 4). The S/D regions 502 each include a S/D confinement region 504 formed in and by the S/D cavity confinement region 410 (shown in FIG. 4), along with a S/D non-confinement region 506 formed in the S/D cavity non-confinement region 408 (shown in FIG. 4). In accordance with aspects of the invention, the S/D regions 502 can be formed using an epitaxial layer growth process. In embodiments of the invention, the S/D regions 502 can be doped and epitaxially grown SiGe. Embedded (or confined) SiGe functions as a S/D stressor for enhanced hole mobility in the final transistor. In embodiments of the invention where the re-grown S/D region 502 are SiGe, the portion of the SiGe S/D region 502 that is grown in the S/D cavity confinement region 410 is confined to the shape of the S/D cavity confinement region 410, which can be any size/shape that is required in the final transistor. In embodiment of the invention, the S/D cavity confinement region 410 is a high-aspect-ratio fin-shaped cavity. The portion of the SiGe S/D 502 that is grown in the S/D cavity non-confinement region 408 is not confined (or embedded) so it is diamond-shaped as a result of the surface orientation dependent growth rate of the epitaxial growth process used to form it.

The S/D regions 502 can be epitaxially grown from gaseous or liquid precursors. More specifically, the S/D regions 502 can be grown using chemical vapor deposition (CVD), vapor-phase epitaxy (VPE), molecular-beam epitaxy (MBE), liquid-phase epitaxy (LPE), or other suitable processes. The S/D regions 502 can be epitaxial silicon, silicon germanium, and/or carbon doped silicon (Si:C) that has been doped during deposition (in-situ doped) by adding dopants, n-type dopants (e.g., phosphorus or arsenic) or p-type dopants (e.g., boron or gallium), depending on the type of transistor. In aspects of the invention, in-situ doping (ISD) is applied to dope the S/D regions 502, thereby creating the necessary junctions in the final transistor structure that will be formed on the IC wafer 100A. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Figure 6:
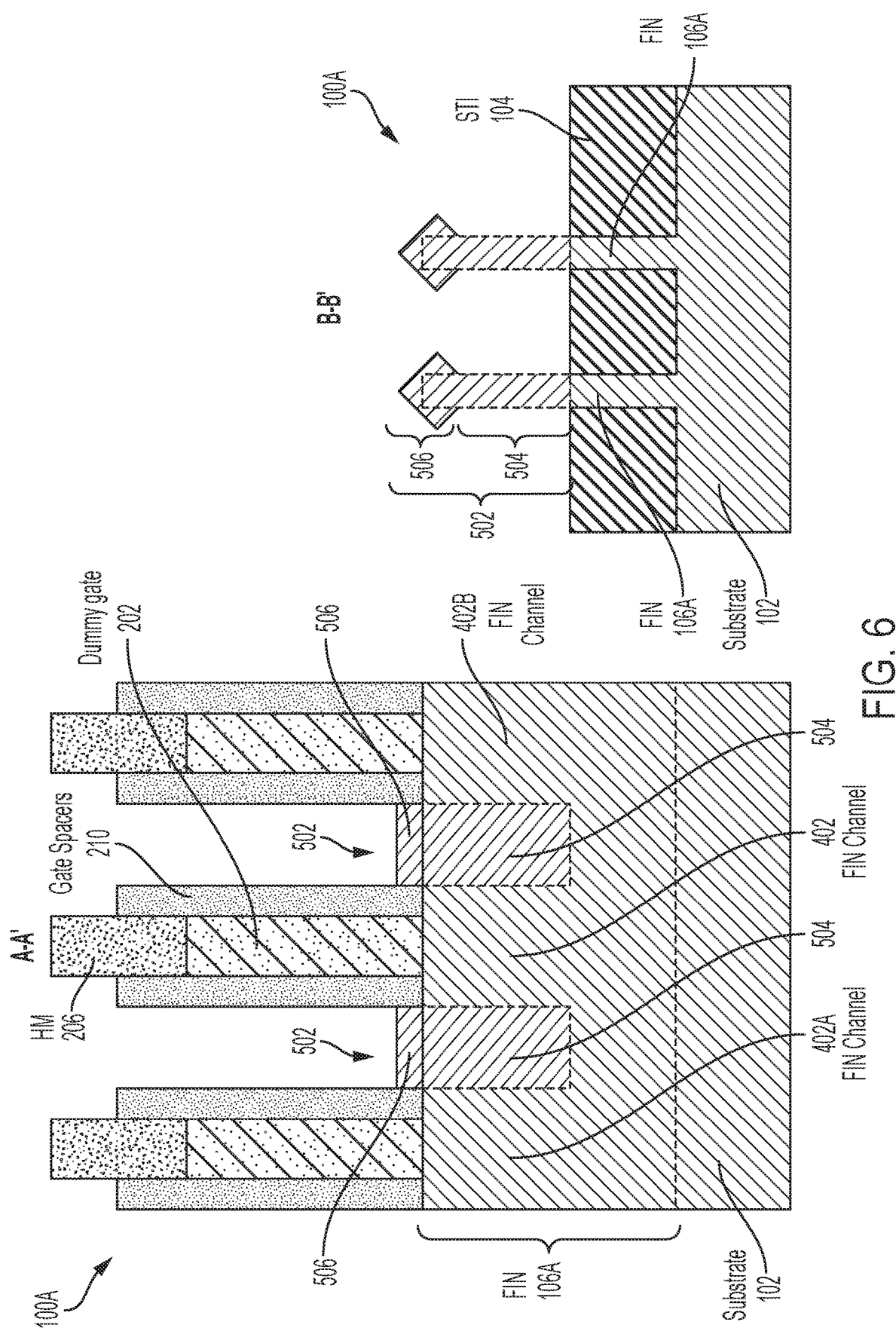
Figure 7:
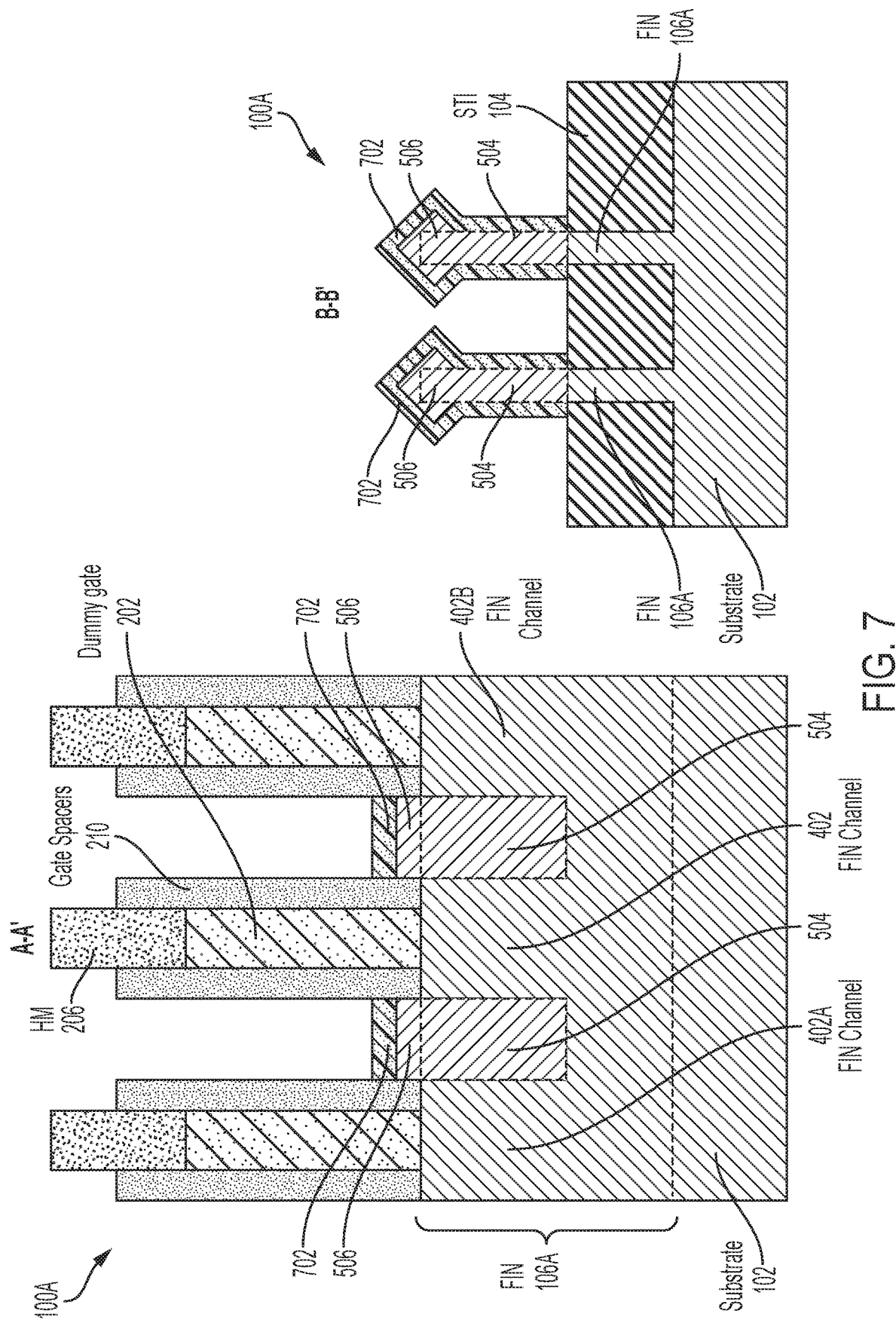

In FIG. 6, the sacrificial fin-confinement regions 302 have been selectively removed in accordance with aspects of the invention, thereby exposing surfaces of the S/D confinement region 504 and the S/D non-confinement region 506 of the S/D regions 502. In accordance with aspects of the invention, the sacrificial fin-confinement regions 302 (shown in FIG. 3) are formed from a sacrificial fin-confinement material configured and arranged to have predetermined characteristics that enable the sacrificial fin-confinement regions 302 to confine the S/D regions 502 during formation of the S/D regions 502, and that further enable the sacrificial fin-confinement region 302 to be selectively removed using conventional wet or dry etch operations. In accordance with aspects of the invention, removal of the sacrificial fin-confinement regions 302 is further facilitated by the sacrificial fin-confinement regions 302 being formed as non-high-aspect-ratio layers that are more wide than narrow. Forming the sacrificial fin-confinement regions 302 as non-high-aspect-ratio layers provides a relatively larger top exposed surface area where a wet/dry etchant can easily interact with and selectively remove the sacrificial fin-confinement material.

FIGS. 7-12 depict cross-sectional views of the of the IC wafer 100A after fabrication operations for forming wrap-around S/D contacts 1202 (shown in FIG. 12) on surfaces of the S/D regions 502 that were exposed as result of selectively removing the sacrificial fin-confinement regions 302 (shown in FIG. 3) according to aspects of the invention. More specifically, in FIG. 7, known fabrication operations have been used to deposit on exposed surfaces of the S/D regions 502 a sacrificial liner 702. In accordance with aspects of the invention, the sacrificial liner 702 functions as a placeholder that defines (and reserves) a space that will be occupied by portions of the to-be-formed wrap-around S/D contacts 1202. In embodiments of the invention, the sacrificial liner 702 can be deposited using an epitaxial growth process. In embodiments of the invention, the sacrificial liner 702 can be any suitable material, including but not limited to a bi-layer of Si/SiGe and/or TiN.

Figure 8:
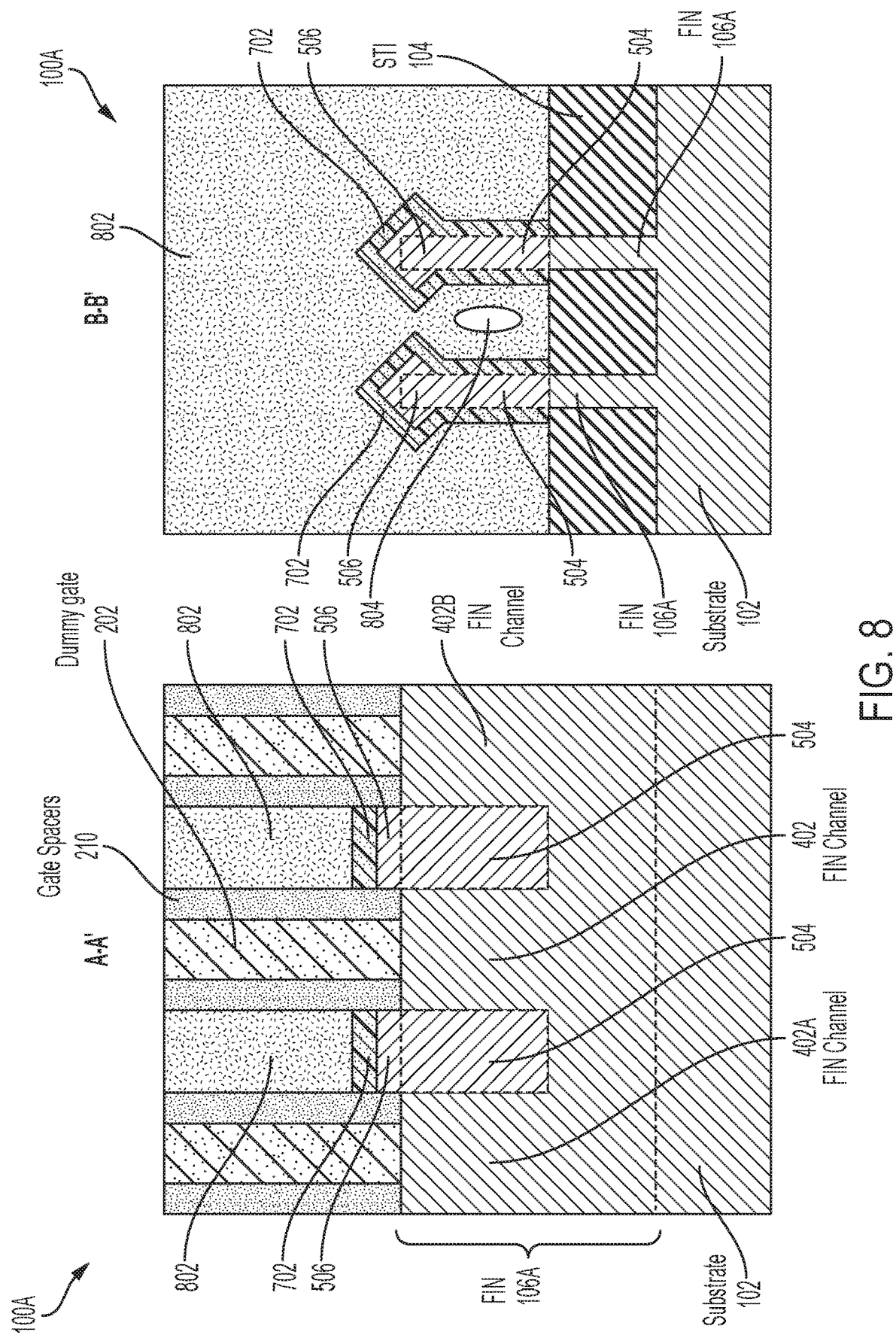

In FIG. 8, known fabrication operations have been used to deposit a fill material layer 802. In embodiments of the invention, the fill material layer 802 is an interlayer dielectric (ILD) conformally deposited over the sacrificial liner 702 such that the ILD does not completely pinch-off between adjacent S/D regions 502, thereby forming an air gap 804 between adjacent S/D regions. In embodiments of the invention, the fill material layer 802 can be conformally deposited using any suitable conformal deposition technique, including, for example, CVD or ALD. The deposited fill material is planarized (e.g., using chemical mechanical planarization (CMP)), thereby removing the hard masks 206 (shown in FIG. 7) and recessing the gate spacers 210 and the dummy gates 202.

Figure 9:
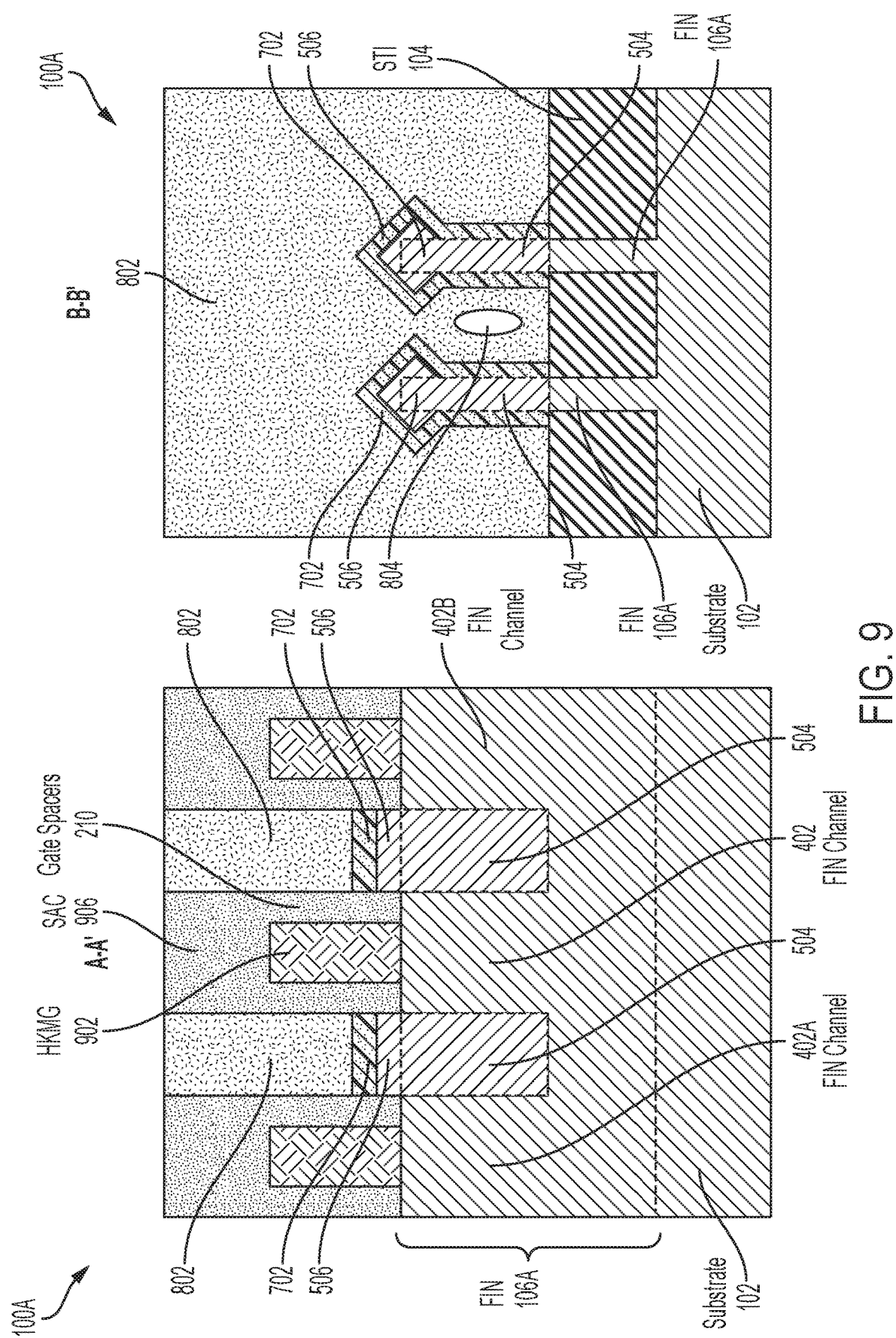

In FIG. 9, known semiconductor fabrication operations (e.g., replacement metal gate (RMG) processes) have been used to remove the dummy gates 202 using, for example, a known etching process, e.g., any suitable wet or gas-phase etch process. The removed dummy gates 202 are replaced with a multi-segmented gate stack structure 902 referred to herein as a high-k metal gate (HKMG) structure 902, which can include a primary metal region, a work function metal (WFM) (not shown separately), and a relatively thin (e.g., from about 0.7 nm to about 3 nm) high-k gate dielectric (e.g., hafnium oxide) (not shown separately). The HKMG structure 902 surrounds the S/D regions 502 and regulates electron flow through the active fin channel 402 between the S/D regions 502 (best shown in FIG. 5).

The primary metal region of the HKMG structure 902 can be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The primary metal region can further include dopants that are incorporated during or after deposition.

Examples of suitable materials for the gate dielectric of the HKMG structure 902 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric can further include dopants such as lanthanum, aluminum, magnesium. In some embodiments of the invention, the gate dielectric can further include silicon oxide, silicon nitride, silicon oxynitride, or any suitable combination of those materials with high-k dielectric material. In embodiments of the invention, the relatively thin gate dielectric is between the fin channel 402 and the primary gate metal region to prevent shorting.

In embodiments of the invention, the WFM layers of the HKMG structure 902 can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

Referring still to FIG. 9, known semiconductor fabrication processes have been used to deposit (e.g., using ALD) additional fill material above the recessed HKMG structure 902 and between the gate spacers 210, thereby forming self-aligned contact (SAC) caps 906. In embodiments of the invention, the SAC caps 906 can be the same material as the gate spacers 210, or can be different material then the gate spacers 210.

Figure 10:
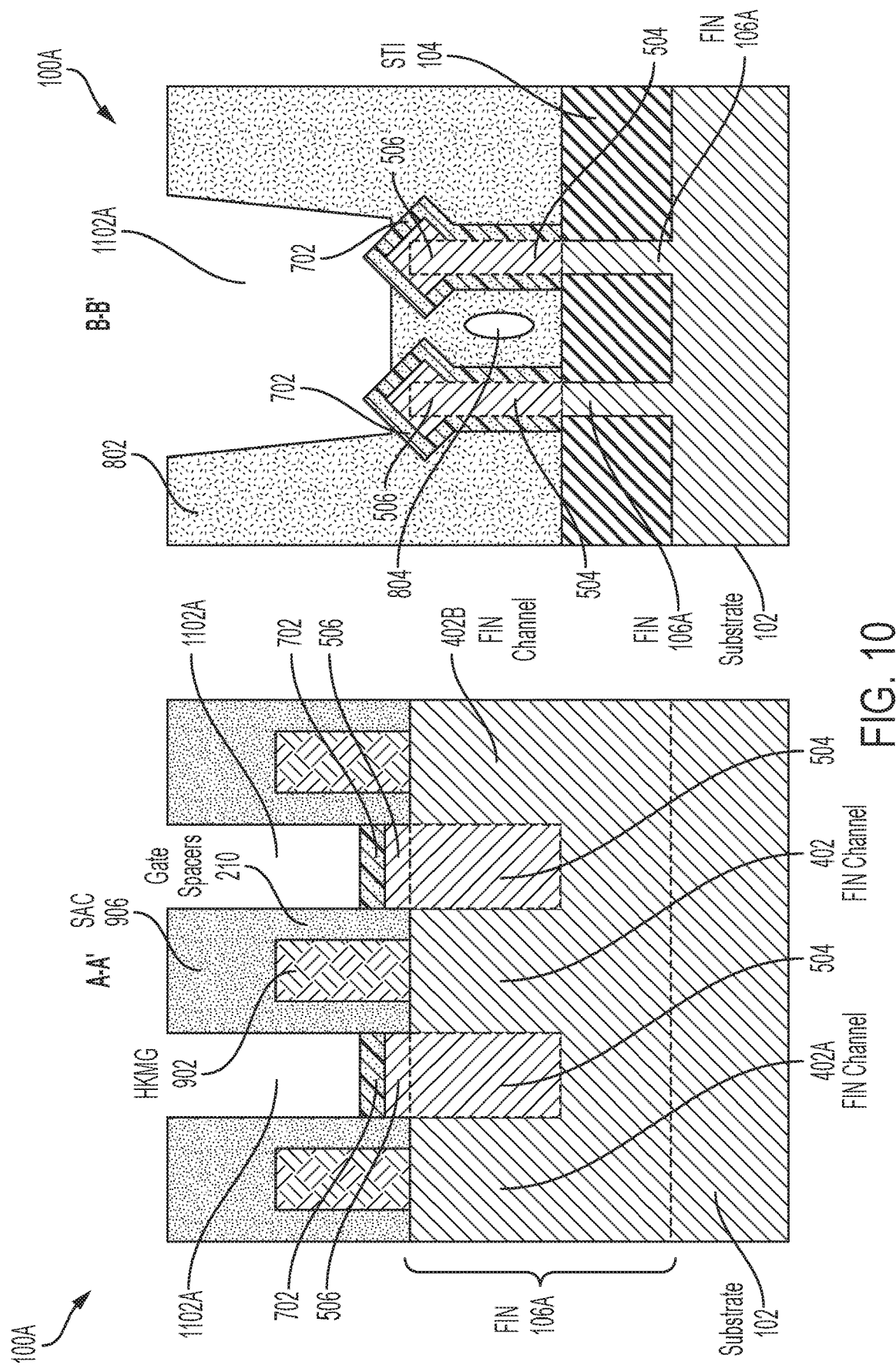

In FIG. 10, known semiconductor fabrication operations (e.g., a suitable wet/dry etch) have been used to selectively remove portions of the fill material layer 802, thereby forming an upper region 1102A of a wrap-around S/D contact cavity 1102 (shown in FIG. 11), and also exposing portions of the sacrificial liner 702.

Figure 11:
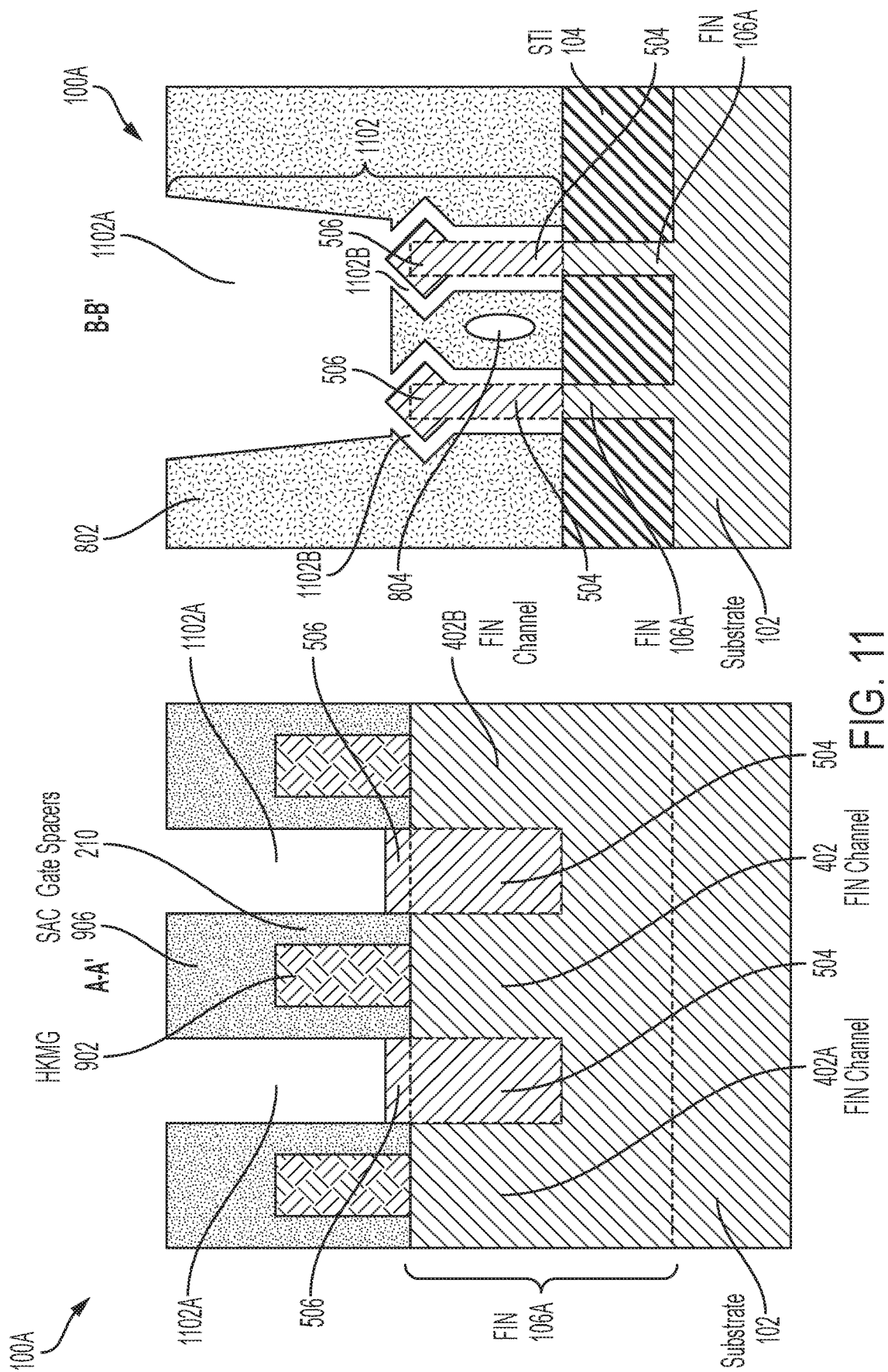

In FIG. 11, known semiconductor fabrication operations (e.g., a suitable wet/dry etch) have been used to remove the sacrificial liners 702, thereby forming a lower region 1102B of the wrap-around S/D contact cavity 1102.

Figure 12:
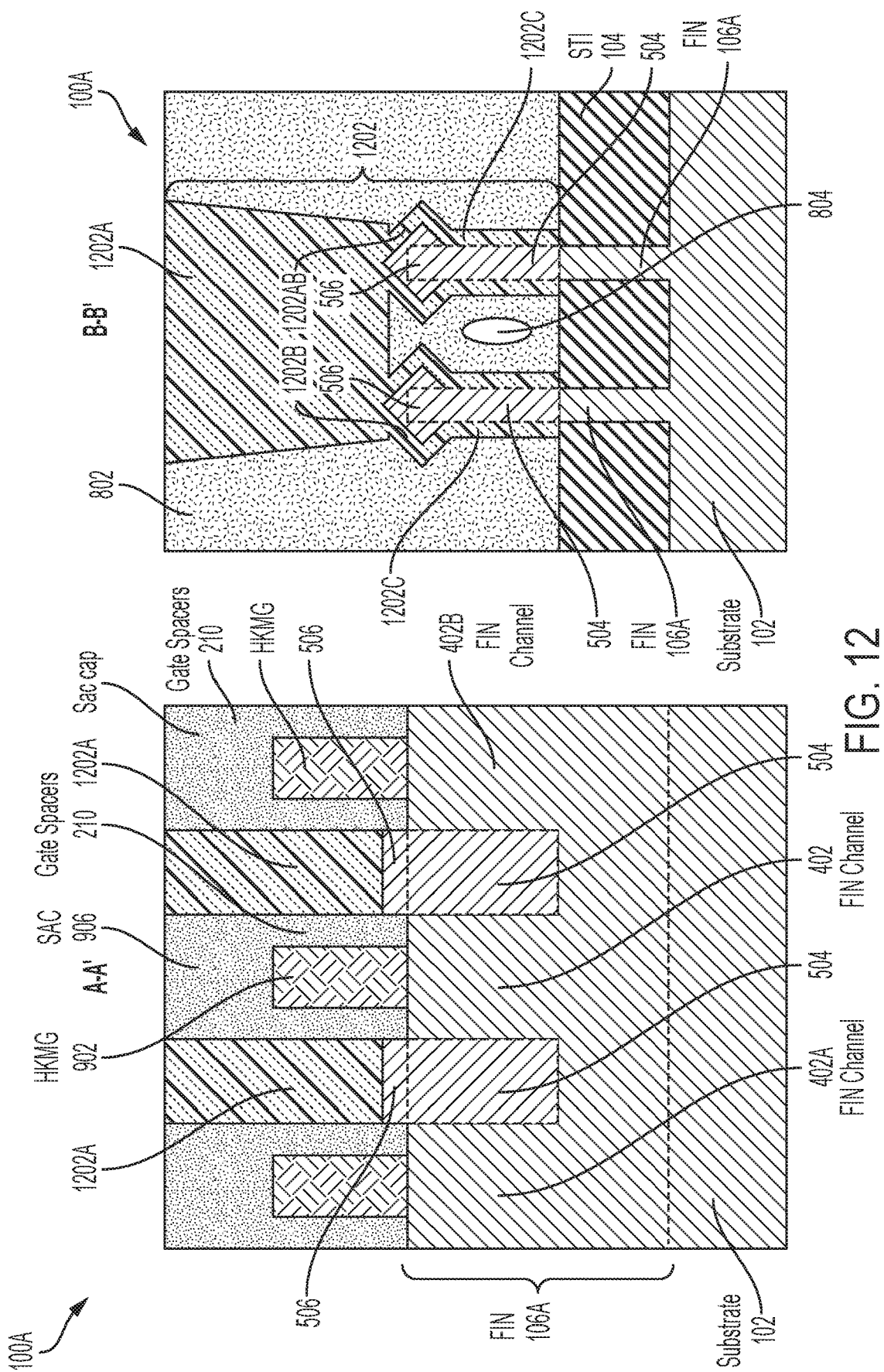
Figure 13:
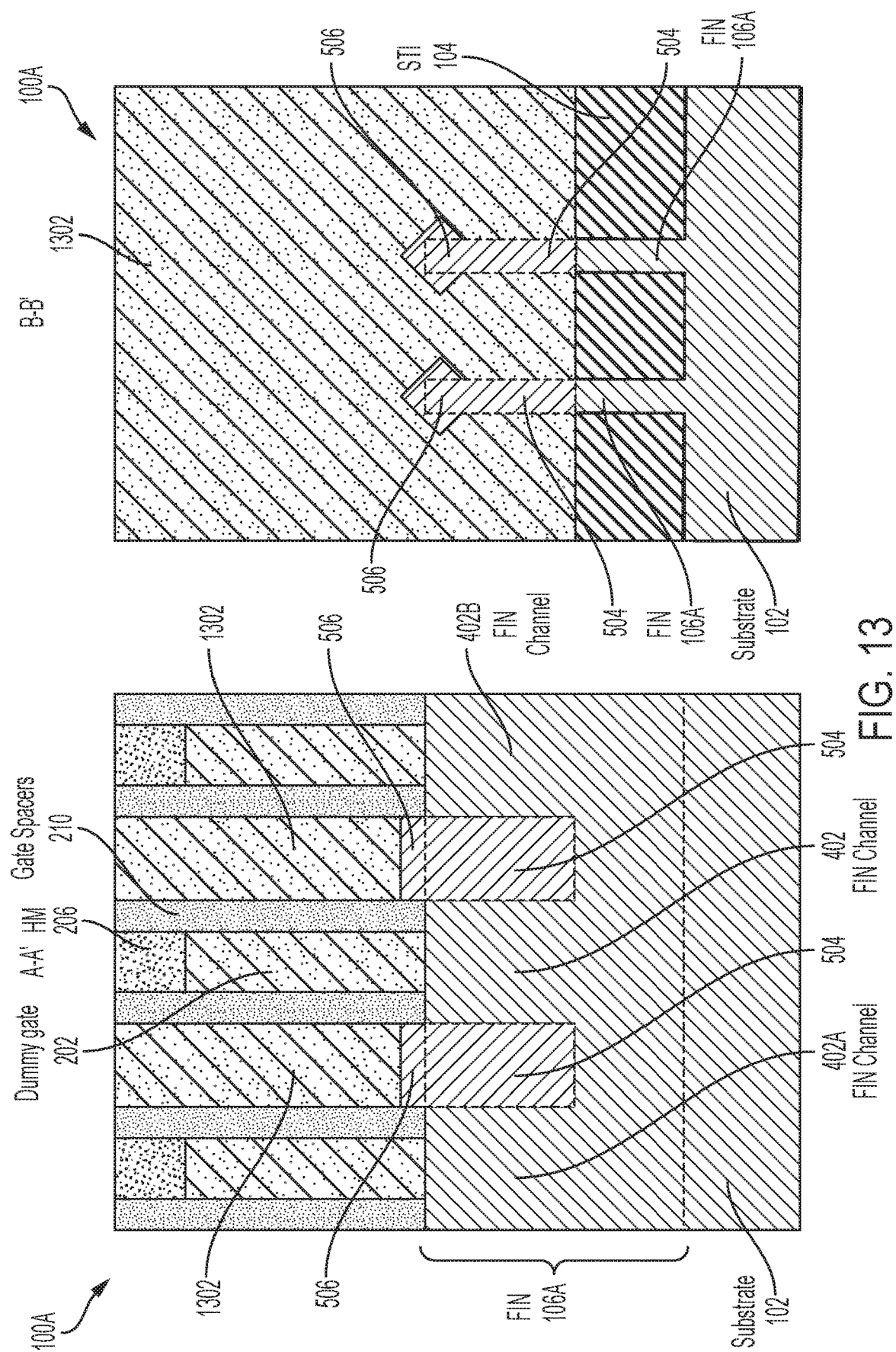

In FIG. 12, known semiconductor fabrication operations have been used to form wrap-around S/D contact stacks 1202 in the wrap-around S/D contact cavities 1102 (shown in FIG. 11). In accordance with aspects of the invention, the wrap-around S/D contact stacks 1202 include a lower region 1202C, a central region 1202B, and an upper region 1202A. The lower region 1202C is formed on the confinement S/D region 504; the central region 1202B is formed on portions of the non-confinement S/D region 506; and the upper region 1202A is formed on portions of the non-confinement S/D region 506. In accordance with aspects of the invention, each region of the wrap-around S/D contact stacks 1202 can include contact liners (not shown separately), contact barrier layers (not shown separately), and S/D contact metal. In embodiments of the invention, the contact liners are configured to assist in minimizing contact resistance. In embodiments of the invention, the contact liners (e.g., Ti) are conformally and selectively deposited on the S/D regions 502 to form silicide regions. Example materials for forming the contact liners include tantalum nitride and tantalum (TaN/Ta), titanium, titanium nitride, cobalt, ruthenium, and manganese. The contact barrier layers can be titanium nitride (TiN), tantalum nitride (TaN), hafnium nitride (HfN), niobium nitride (NbN), tungsten nitride (WN), or combinations thereof, where the contact barrier layers can prevent diffusion and/or alloying of the S/D contact metal with the S/D regions 502. In various embodiments of the invention, the contact barrier layers and/or the contact liners can be conformally deposited in the wrap-around S/D contact cavities 1102 by ALD, CVD, MOCVD, PECVD, or combinations thereof. The S/D contact metal can be tungsten (W), aluminum (Al), copper (Cu), cobalt (Co). The S/D contact metal can also be formed from any of the conductive materials previously described herein as suitable conductive materials for the HKMG structure 902. In embodiments of the invention, the S/D contact metal can be formed conformally by ALD, CVD, and/or PVD. By using a conformal process to deposit the S/D contact metal, a uniform thickness of material is across all exposed surfaces regardless of whether the surface is facing upward or facing downward. By controlling the sequence of the conformal depositions of the liner, the barrier, and the contact metal, the appropriate positioning of the liner, the barrier and the contact metal in the bottom portions of the wrap-around S/D contacts 1202 is ensured. As noted above, the conformal contact liners (e.g., Ti) needed for silicide formation can be selectively deposited on the S/D regions 502. Known gate contact fabrication methods can be used to form contacts (not shown) extending through the SAC caps 906 to contact the HKMG structure 902.

FIGS. 13-19 depict cross-sectional views of the of the IC wafer 100A after fabrication operations (shown in FIG. 2-6) for forming wrap-around S/D contacts 1902 (shown in FIG. 19) on surfaces of the S/D regions 502 that were exposed as result of selectively removing the sacrificial fin-confinement regions 302 according to aspects of the invention. More specifically, in FIG. 13, known fabrication operations have been used to deposit on exposed surfaces of the S/D regions 502 a sacrificial layer 1302. In accordance with aspects of the invention, the sacrificial layer 1302 functions as a placeholder that will be used to define (and reserve) a space that will be occupied by portions of the to-be-formed wrap-around S/D contacts 1902. In embodiments of the invention, the sacrificial layer 1302 can be deposited using any suitable deposition process, including, for example, CVD and/or ALD. In embodiments of the invention, the sacrificial layer 1302 can be any suitable material, including but not limited to a thin layer of $SiO_2$ having amorphous Si (aSi) formed thereon. In embodiments of the invention, the layer of $SiO_2$ separates the aSi from the S/D regions 502 so that when the a-Si is removed during subsequent fabrication operations the $SiO_2$ protects the underlying S/D regions 502.

Figure 14:
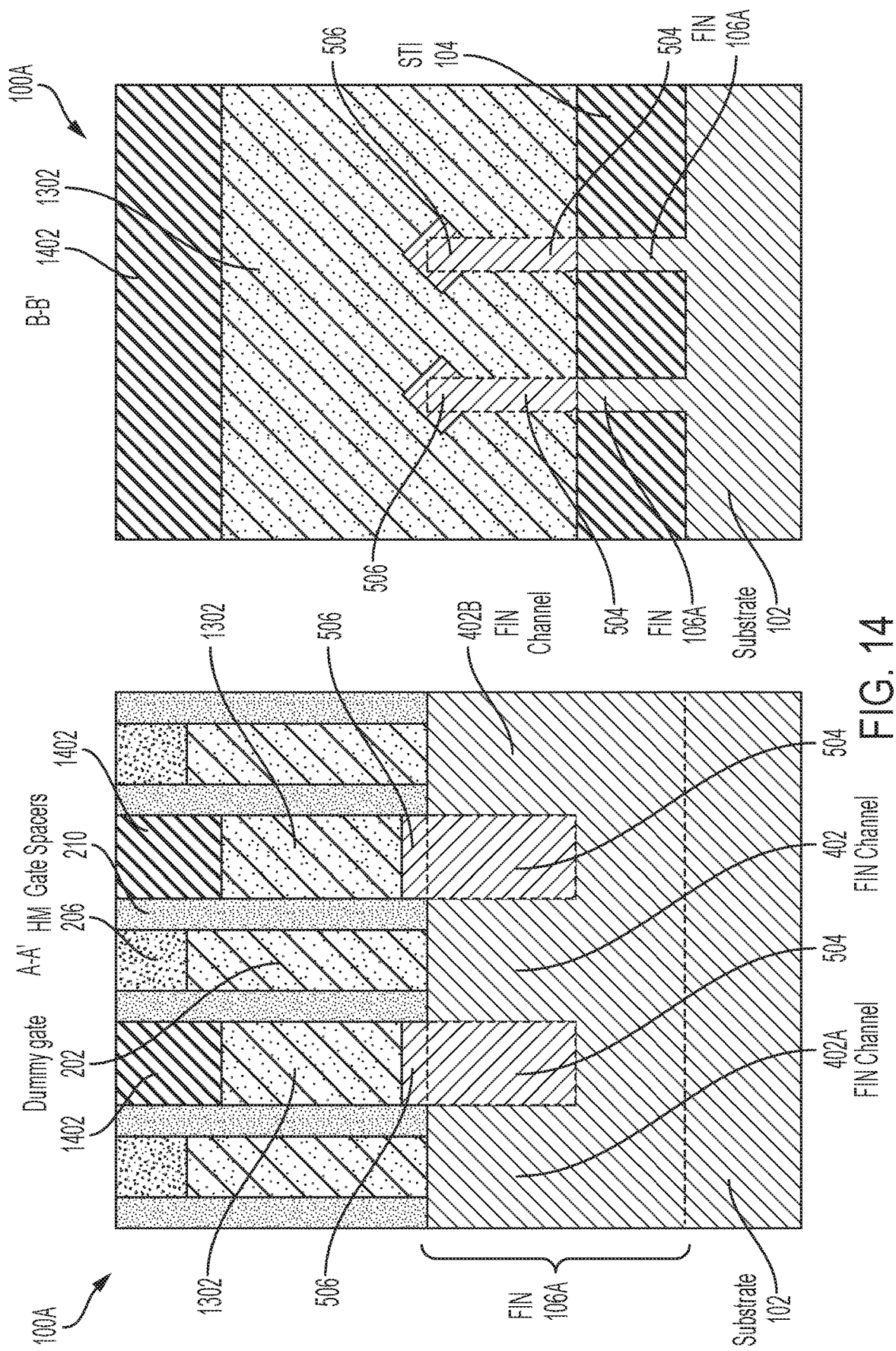

In FIG. 14, known fabrication operations (e.g., suitable wet/dry etch processes) have been used to recess the sacrificial layer 1302 and deposit thereon (e.g., using ALD) additional fill material, thereby forming protective caps 1402, configured and arranged to protect the sacrificial layer 1302 during subsequent fabrication operations. In embodiments of the invention, the protective caps 1402 can be any suitable protective material, including, for example, an oxide.

Figure 15:
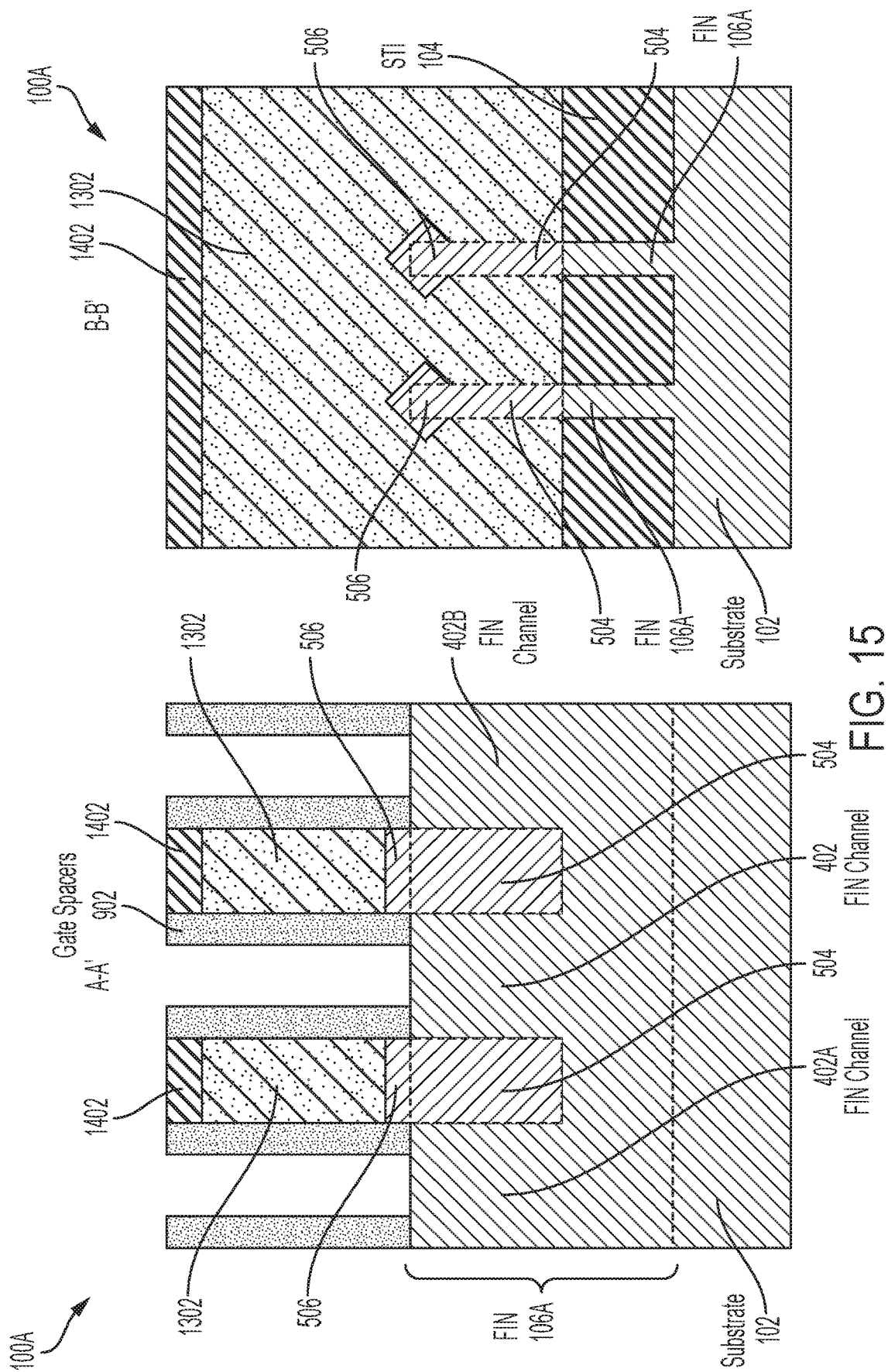

In FIG. 15, the IC wafer 100A is planarized (e.g., using CMP), thereby removing the hard masks 206 and recessing the gate spacers 210 and the protective caps 1402. Additionally, known semiconductor fabrication operations (e.g., replacement metal gate (RMG) processes) have been used to remove the dummy gates 202 using, for example, a known etching process, e.g., any suitable wet or gas-phase etch process.

Figure 16:
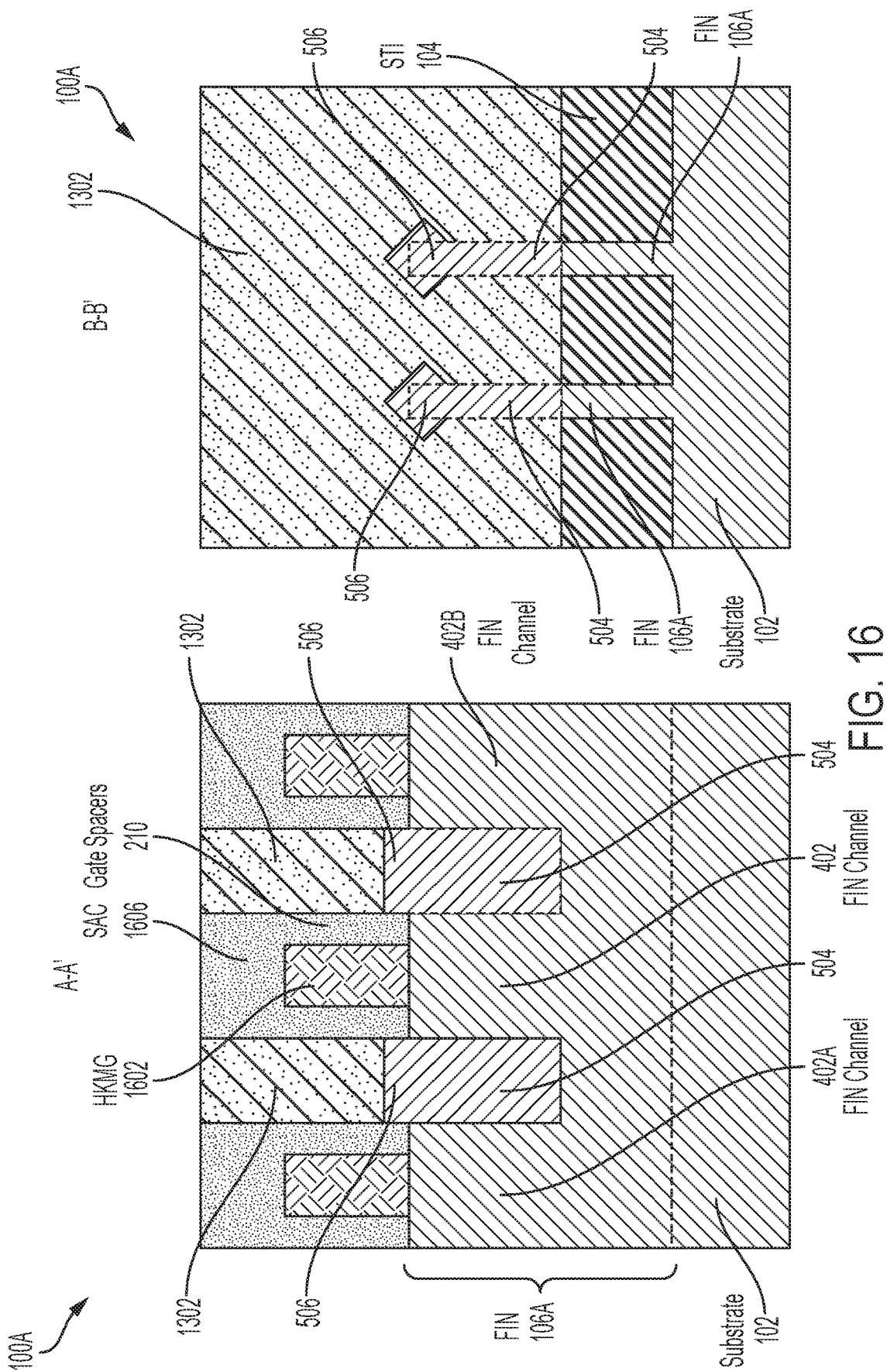

In FIG. 16, the removed dummy gates 202 (shown in FIG. 15) are replaced with a multi-segmented gate stack structure referred to herein as a high-k metal gate (HKMG) structure 1602. The HKMG structure 1602 has the same structure and is fabricated in the same manner as the HKMG structure 902 (shown in FIG. 9). Because all of the descriptions of the HKMG 902 provided herein apply equally to the HKMG 1602, in the interest of brevity these descriptions will not be repeated here.

Referring still to FIG. 16, known semiconductor fabrication processes have been used to deposit (e.g., using ALD) additional fill material above the recessed HKMG structure 1602 and between the gate spacers 210, thereby forming self-aligned contact (SAC) caps 1606. In embodiments of the invention, the SAC caps 1606 can the same material as the gate spacers 210, or can be different material then the gate spacers 210.

Figure 17:
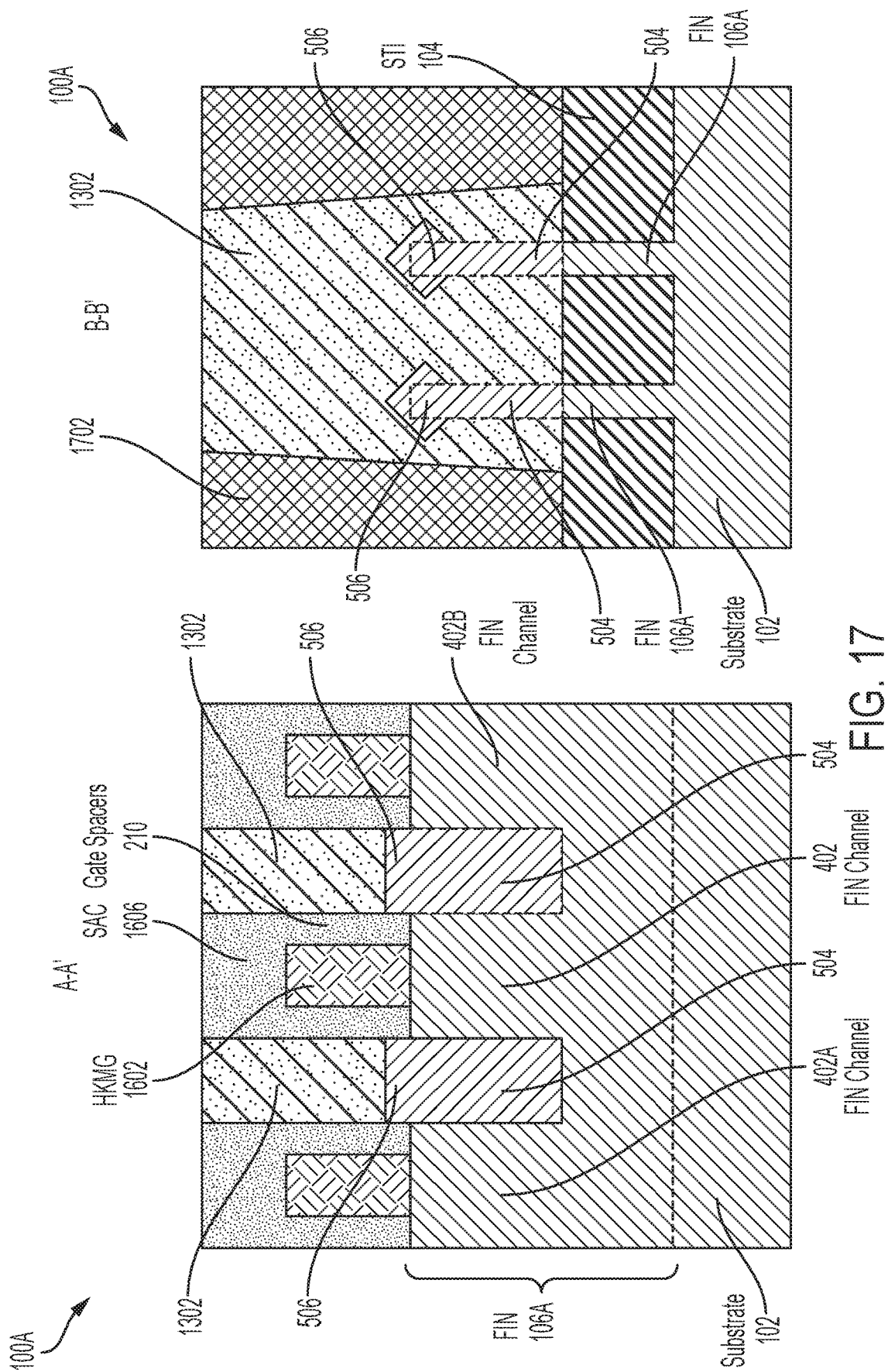
Figure 19:
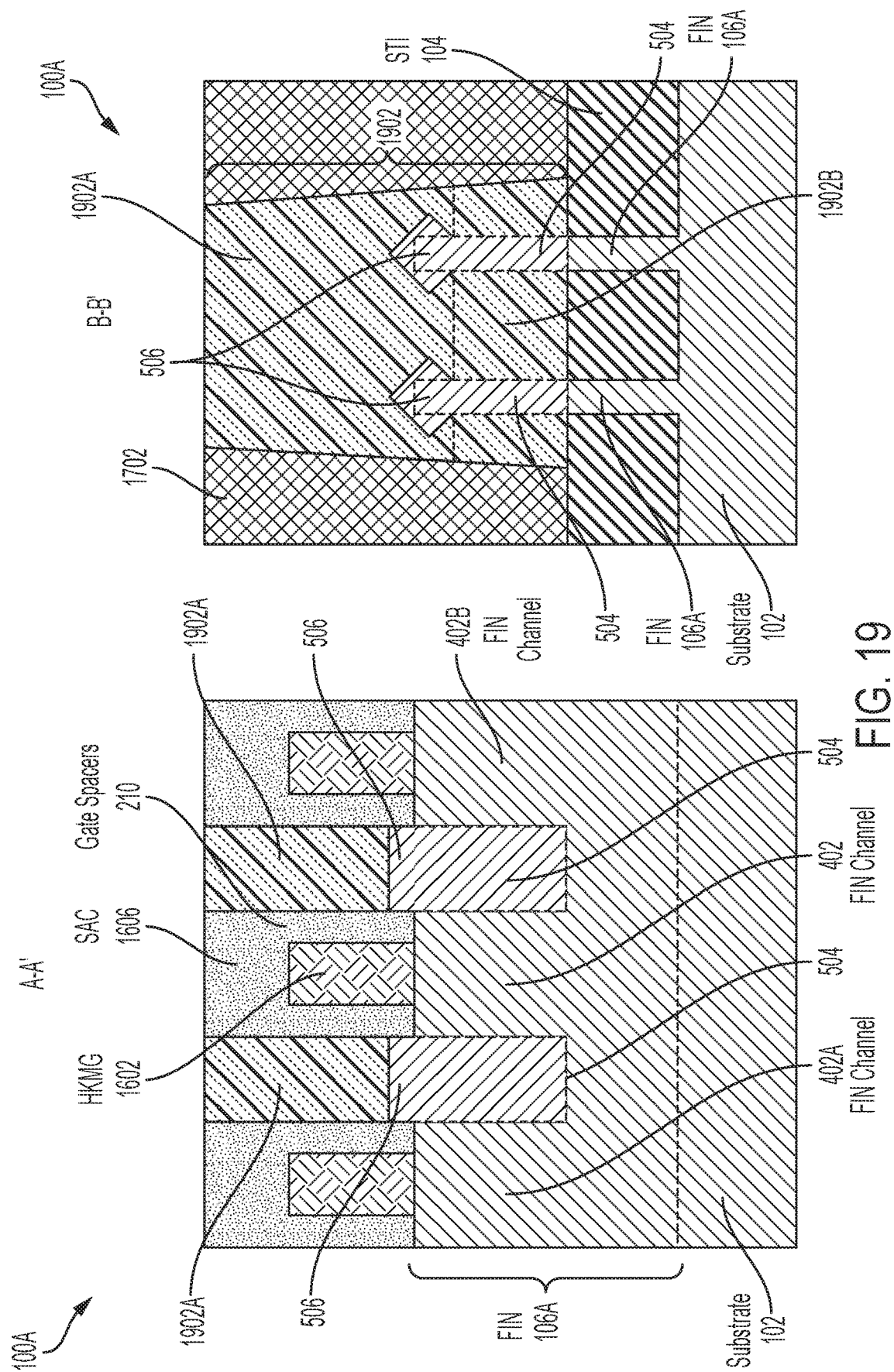

In FIG. 17, known semiconductor fabrication operations (e.g., a suitable cutting process and/or a suitable wet/dry etch process) have been used to selectively remove portions of the sacrificial layer 1302, thereby providing the sacrificial layer 1302 with a footprint and shape that matches the to-be-formed wrap-around S/D contact 1902 (shown in FIG. 19). A fill material 1702 is deposited in the area that was occupied by the removed portions of the sacrificial layers 1302.

Figure 18:
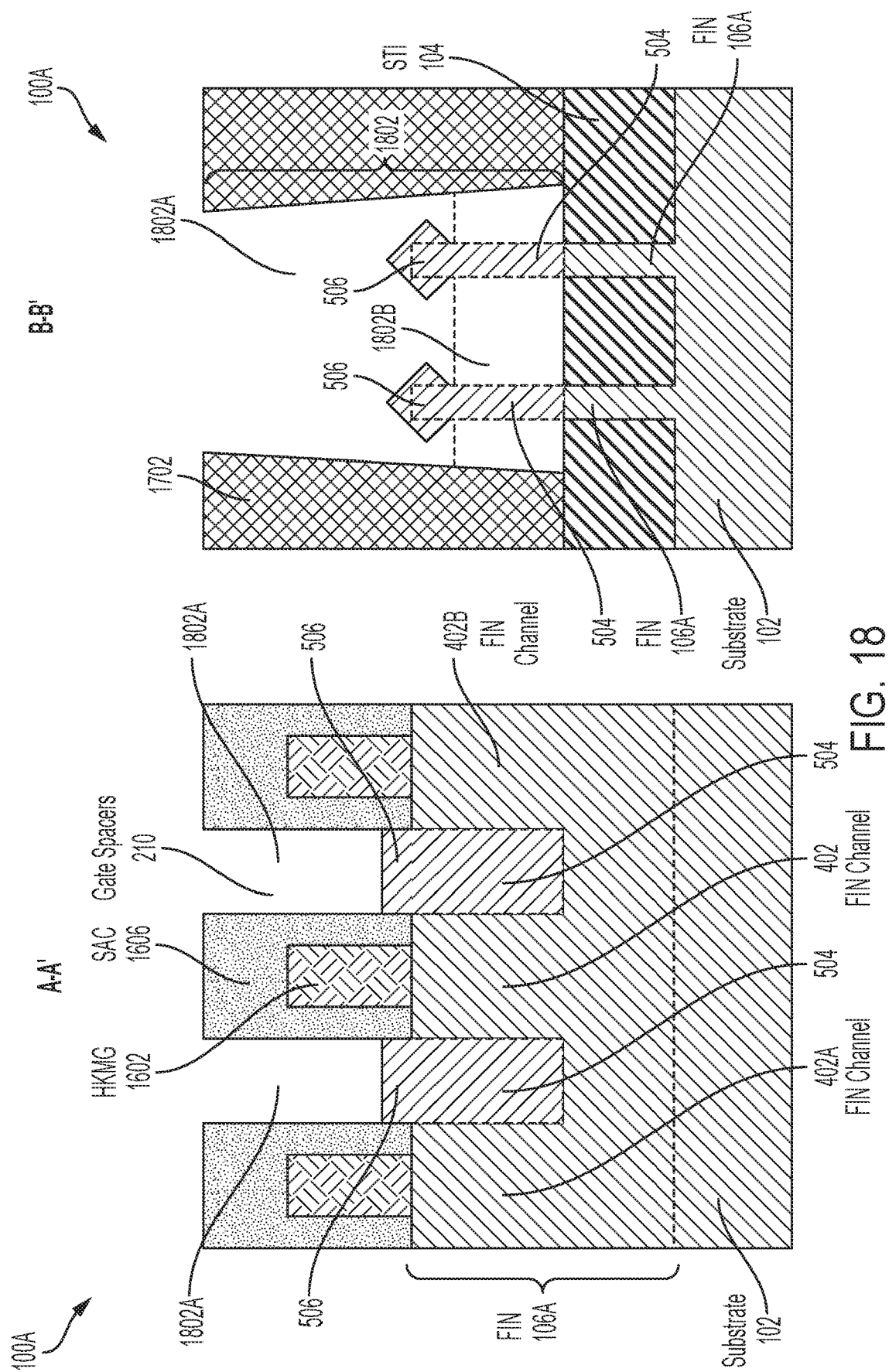

In FIG. 18, known semiconductor fabrication operations (e.g., a suitable wet/dry etch) have been used to remove the sacrificial layers 1302, thereby forming wrap-around S/D contact cavities 1802 having upper S/D cavity regions 1802A and lower S/D cavity regions 1802B.

In FIG. 19, known semiconductor fabrication operations have been used to form wrap-around S/D contact stacks 1902 in the wrap-around S/D contact cavities 1802. In accordance with aspects of the invention, the wrap-around S/D contact stacks 1902 include upper regions 1902A formed on the non-confinement S/D regions 506, along with lower regions 1902B formed on the confinement S/D regions 504. In embodiments of the invention, each region of the wrap-around S/D contact stacks 1902 can include contact liners (not shown separately), contact barrier layers (not shown separately), and S/D contact metal. In embodiments of the invention, the contact liners are configured to assist in minimizing contact resistance. In embodiments of the invention, the contact liners (e.g., Ti) are conformally and selectively deposited on the S/D regions 502 to form silicide regions. Example materials for forming the contact liners include tantalum nitride and tantalum (TaN/Ta), titanium, titanium nitride, cobalt, ruthenium, and manganese. The contact barrier layers can be titanium nitride (TiN), tantalum nitride (TaN), hafnium nitride (HfN), niobium nitride (NbN), tungsten nitride (WN), or combinations thereof, where the contact barrier layers can prevent diffusion and/or alloying of the S/D contact metal with the S/D regions 502. In various embodiments of the invention, the contact barrier layers and/or the contact liners can be conformally deposited in the wrap-around S/D contact cavities 1802 by ALD, CVD, MOCVD, PECVD, or combinations thereof. The S/D contact metal can be tungsten (W), aluminum (Al), copper (Cu), cobalt (Co). The S/D contact metal can also be formed from any of the conductive materials previously described herein as suitable conductive materials for the HKMG structures 902, 1602. In embodiments of the invention, the S/D contact metal can be formed conformally by ALD, CVD, and/or PVD. By using a conformal process to deposit the S/D contact metal, a uniform thickness of material is across all exposed surfaces regardless of whether the surface is facing upward or facing downward. By controlling the sequence of the conformal depositions of the liner, the barrier, and the contact metal, the appropriate positioning of the liner, the barrier and the contact metal in the bottom portions of the wrap-around S/D contacts 1902 is ensured. As noted above, the conformal contact liners (e.g., Ti) needed for silicide formation can be selectively deposited on the S/D regions 502. Known gate contact fabrication methods can be used to form contacts (not shown) extending through the SAC caps 1606 to contact the HKMG structure 1602.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device on an integrated circuit (IC), the method comprising:
    forming a containment structure comprising a non-sacrificial fin-containment region and a sacrificial fin-containment region, wherein the containment structure is configured to define a source or drain (S/D) cavity;
    forming a S/D region in the S/D cavity;
    wherein the S/D region comprises a contained S/D region defined by the containment structure;
    wherein the S/D region further comprises a non-contained S/D region positioned above the containment structure;
    wherein the IC includes a plurality of spacers;
    wherein a characteristic of the sacrificial fin-containment region enables the sacrificial fin-containment region to be selective to an etchant that is non-selective to the non-sacrificial fin-containment region and non-selective to the plurality of spacers on the IC; and
    exposing the containment structure and the plurality of spacers to the etchant;
    wherein exposing the containment structure and the plurality of spacers to the etchant selectively removes the sacrificial fin-containment region and exposes sidewalls of the contained S/D region.

2. The method of claim 1, wherein:
    forming the S/D region comprises epitaxially growing the S/D region at a predetermined temperature required for epitaxial growth operations; and
    the sacrificial fin-containment region comprises a fin-containment material configured to not substantially degrade when exposed to the predetermined temperature required for epitaxial growth operations.

3. The method of claim 2, wherein the predetermined temperature required for epitaxial growth operations is within a range from about 1100 degrees Celsius to about 1200 degrees Celsius.

4. The method of claim 3, wherein the sacrificial fin-containment material comprises spin-on carbon.

5. The method of claim 1 further comprising forming a wrap-around S/D contact positioned on:
- the exposed sidewalls of the contained S/D region; and
- the non-contained S/D region.

6. The method of claim 5, wherein forming the wrap-around S/D contact comprises depositing a sacrificial liner on:
- the exposed sidewalls of the contained S/D region; and
- the non-contained S/D region.

7. The method of claim 6, wherein forming the wrap-around S/D contact further comprises:
- depositing an interlayer dielectric (ILD) region on the sacrificial liner;
- removing a portion of the ILD to provide access to the sacrificial liner;
- removing the sacrificial liner such that the removed portion of the ILD region and a space that was occupied the sacrificial liner define a wrap-around S/D contact cavity; and
- forming the wrap-around S/D contact in the wrap-around S/D contact cavity.

8. The method of claim 5, wherein forming the wrap-around S/D contact comprises depositing a sacrificial material on:
- the exposed sidewalls of the contained S/D region; and
- the non-contained S/D region.

9. The method of claim 8, wherein the sacrificial material is positioned within a dielectric material.

10. The method of claim 9, wherein the sacrificial material is positioned within the dielectric material by cutting away portions of the sacrificial material and replacing the cut away portions of the sacrificial material with the dielectric material.

11. The method of claim 9, wherein forming the wrap-around S/D contact further comprises removing the sacrificial material such that the dielectric material and the S/D region define a wrap-around S/D contact cavity.

12. The method of claim 11, wherein forming the wrap-around S/D contact further comprises forming the wrap-around S/D contact in the wrap-around S/D contact cavity.

13. A method of forming a semiconductor device on an integrated circuit (IC), the method comprising:
- forming a containment structure comprising a first channel fin structure, a second channel fin structure, and a sacrificial fin-containment region, wherein the containment structure is configured to define a source or drain (S/D) cavity;
- forming a S/D region in the S/D cavity;
- wherein the S/D region comprises a contained S/D region defined by the containment structure;
- wherein the S/D region further comprises a non-contained S/D region positioned above the containment structure;
- wherein the IC includes a plurality of spacers;
- wherein a characteristic of the sacrificial fin-containment region enables the sacrificial fin-containment region to be selective to an etchant that is non-selective to the first channel fin structure, the second channel fin structure, and the plurality of spacers on the IC; and
- exposing the containment structure and the plurality of spacers to the etchant;
- wherein exposing the containment structure and the plurality of spacers to the etchant selectively removes the sacrificial fin-containment region and exposes sidewalls of the contained S/D region.

14. The method of claim 13, wherein:
- forming the S/D region comprises epitaxially growing the S/D region at a predetermined temperature required for epitaxial growth operations; and
- the sacrificial fin-containment region comprises a fin-containment material configured to not substantially degrade when exposed to the predetermined temperature required for epitaxial growth operations.

15. The method of claim 14, wherein the sacrificial fin-containment material comprises spin-on carbon.

16. The method of claim 13 further comprising forming a wrap-around S/D contact positioned on:
- the exposed sidewalls of the contained S/D region; and
- the non-contained S/D region.

17. The method of claim 13, wherein forming the wrap-around S/D contact comprises depositing a sacrificial liner on:
- the exposed sidewalls of the contained S/D region; and
- the non-contained S/D region.

18. The method of claim 17, wherein forming the wrap-around S/D contact further comprises:
- depositing an interlayer dielectric (ILD) region on the sacrificial liner;
- removing a portion of the ILD to provide access to the sacrificial liner;
- removing the sacrificial liner such that the removed portion of the ILD region and a space that was occupied the sacrificial liner define a wrap-around S/D contact cavity; and
- forming the wrap-around S/D contact in the wrap-around S/D contact cavity.

19. The method of claim 16, wherein forming the wrap-around S/D contact further comprises:
- depositing a sacrificial material within a dielectric material and around the S/D region;
- wherein the sacrificial material is positioned within the dielectric material by cutting away portions of the sacrificial material and replacing the cut away portions of the sacrificial material with the dielectric material;
- removing the sacrificial material such that the dielectric material and the S/D region define a wrap-around S/D contact cavity; and
- forming the wrap-around S/D contact in the wrap-around S/D contact cavity.

* * * * *